(12) United States Patent
Aguirre et al.

(10) Patent No.: US 12,085,999 B2
(45) Date of Patent: *Sep. 10, 2024

(54) POWER SUPPLY ASSEMBLY WITH FAN ASSEMBLY FOR ELECTRONIC DEVICE

(71) Applicant: Magic Leap, Inc., Plantation, FL (US)

(72) Inventors: John Aguirre, Sunrise, FL (US); Youlin Jin, Sunrise, FL (US); Ralph Remsburg, Midland, TX (US); Guillermo Padin Rohena, Coral Springs, FL (US); Evan Francis Rynk, Boca Raton, FL (US); Carlos Julio Suate Pedroza, Miramar, FL (US); Gary Quartana, Jr., Parkland, FL (US); Bradley Fraser, Miami Beach, FL (US); Haney Awad, Fort Lauderdale, FL (US); William Wheeler, Fort Lauderdale, FL (US); Shigeru Natsume, Weston, FL (US)

(73) Assignee: MAGIC LEAP, INC., Plantation, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/243,048

(22) Filed: Sep. 6, 2023

(65) Prior Publication Data

US 2023/0409093 A1 Dec. 21, 2023

Related U.S. Application Data

(63) Continuation of application No. 17/127,826, filed on Dec. 18, 2020, now Pat. No. 11,797,065, which is a
(Continued)

(51) Int. Cl.
*G06F 1/16* (2006.01)
*F04D 25/06* (2006.01)
(Continued)

(52) U.S. Cl.
CPC ......... *G06F 1/188* (2013.01); *F04D 25/0613* (2013.01); *F04D 29/4226* (2013.01);
(Continued)

(58) Field of Classification Search
CPC ........ G06F 1/188; G06F 1/1613; G06F 1/163; G06F 1/1635; G06F 1/181; G06F 1/203;
(Continued)

(56) References Cited

U.S. PATENT DOCUMENTS

| 1,921,218 A | 8/1933 | Colby |
| 2,853,539 A | 9/1958 | Kerr |

(Continued)

FOREIGN PATENT DOCUMENTS

| CN | 103336532 A | 10/2013 |
| CN | 104566757 A | 4/2015 |

(Continued)

OTHER PUBLICATIONS

"3D Hologram No Glass No CD Case", YouTube Video, URL= https://www.youtube.com/watch?v=49BhZIQvjLW, retrieved Jul. 18, 2017. (3 pages).

(Continued)

*Primary Examiner* — Amir A Jalali
(74) *Attorney, Agent, or Firm* — Seed IP Law Group LLP

(57) ABSTRACT

A fan assembly is disclosed. The fan assembly can include a first support frame. The fan assembly can comprise a shaft assembly having a first end coupled with the first support frame and a second end disposed away from the first end. A second support frame can be coupled with the first support frame and disposed at or over the second end of the shaft assembly. An impeller can have fan blades coupled with a hub, the hub being disposed over the shaft assembly for rotation between the first and second support frames about (Continued)

a longitudinal axis. Transverse loading on the shaft assembly can be controlled by the first and second support frames.

19 Claims, 28 Drawing Sheets

Related U.S. Application Data continuation of application No. 15/992,032, filed on May 29, 2018, now Pat. No. 10,871,806.

(60) Provisional application No. 62/671,379, filed on May 14, 2018, provisional application No. 62/512,635, filed on May 30, 2017.

(51) Int. Cl.
| | |
|---|---|
| *F04D 29/42* | (2006.01) |
| *F04D 29/58* | (2006.01) |
| *F04D 29/60* | (2006.01) |
| *G02B 27/01* | (2006.01) |
| *G06F 1/18* | (2006.01) |
| *G06F 1/20* | (2006.01) |
| *G06F 3/01* | (2006.01) |
| *G06T 19/00* | (2011.01) |
| *H05K 7/14* | (2006.01) |
| *H05K 7/20* | (2006.01) |

(52) U.S. Cl.
CPC ....... *F04D 29/5853* (2013.01); *F04D 29/601* (2013.01); *G02B 27/017* (2013.01); *G06F 1/1613* (2013.01); *G06F 1/163* (2013.01); *G06F 1/1635* (2013.01); *G06F 1/181* (2013.01); *G06F 1/203* (2013.01); *G06F 3/011* (2013.01); *G06T 19/006* (2013.01); *H05K 7/14* (2013.01); *H05K 7/20172* (2013.01); *G02B 2027/0178* (2013.01)

(58) Field of Classification Search
CPC ........ G06F 1/1658; G06F 1/1662; G06F 1/20; G06F 1/011; G06F 3/011; F04D 25/0673; F04D 25/0613; F04D 25/08; F04D 25/166; F04D 17/16; F04D 29/4213; F04D 29/42; F04D 29/441; F04D 29/4226; F04D 29/444; F04D 29/5853; F04D 29/601; H05K 7/14; H05K 7/20; H05K 7/20172; H01L 23/4006; H01L 23/467; G06T 19/006; G02B 27/017
See application file for complete search history.

(56) References Cited

U.S. PATENT DOCUMENTS

| | | | |
|---|---|---|---|
| 4,385,911 A | 5/1983 | Popeil et al. | |
| 5,082,422 A | 1/1992 | Wang | |
| 5,291,560 A | 3/1994 | Daugman | |
| 5,610,678 A * | 3/1997 | Tsuboi | G03B 13/02 |
| | | | 348/E5.025 |
| 5,825,443 A | 10/1998 | Kawasaki et al. | |
| 5,914,629 A | 6/1999 | Maki | |
| 5,993,060 A | 11/1999 | Sakurai | |
| 6,037,876 A | 3/2000 | Crouch | |
| 6,349,864 B1 | 2/2002 | Lee | |
| 6,561,762 B1 | 5/2003 | Horng et al. | |
| 6,594,630 B1 | 7/2003 | Zlokarnik et al. | |
| 6,850,221 B1 | 2/2005 | Tickle | |
| D514,570 S | 2/2006 | Ohta | |
| 7,961,471 B2 | 6/2011 | Odanaka et al. | |
| 8,712,598 B2 | 4/2014 | Dighde et al. | |
| 8,950,867 B2 | 2/2015 | Macnamara | |
| 9,081,426 B2 | 7/2015 | Armstrong | |
| 9,215,293 B2 | 12/2015 | Miller | |
| D752,529 S | 3/2016 | Loretan et al. | |
| 9,310,559 B2 | 4/2016 | Macnamara | |
| 9,323,325 B2 | 4/2016 | Perez et al. | |
| 9,348,143 B2 | 5/2016 | Gao et al. | |
| D758,367 S | 6/2016 | Natsume | |
| D759,657 S | 6/2016 | Kujawski et al. | |
| 9,398,357 B2 | 7/2016 | Berkman et al. | |
| 9,417,452 B2 | 8/2016 | Schowengerdt et al. | |
| 9,470,906 B2 | 10/2016 | Kaji et al. | |
| 9,547,174 B2 | 1/2017 | Gao et al. | |
| 9,572,552 B1 | 2/2017 | Bodor et al. | |
| 9,671,566 B2 | 6/2017 | Abovitz et al. | |
| D794,288 S | 8/2017 | Beers et al. | |
| 9,740,006 B2 | 8/2017 | Gao | |
| D797,749 S | 9/2017 | Awad et al. | |
| 9,791,700 B2 | 10/2017 | Schowengerdt | |
| D805,734 S | 12/2017 | Fisher et al. | |
| 9,851,563 B2 | 12/2017 | Gao et al. | |
| 9,857,591 B2 | 1/2018 | Welch et al. | |
| 9,874,749 B2 | 1/2018 | Bradski et al. | |
| 10,037,062 B1 | 7/2018 | Bhopte et al. | |
| 10,216,312 B2 | 2/2019 | Park et al. | |
| 10,536,690 B2 | 1/2020 | Kaehler | |
| 10,871,806 B2 | 12/2020 | Aguirre et al. | |
| 2002/0154483 A1 | 10/2002 | Homer et al. | |
| 2004/0146405 A1 | 7/2004 | Hung | |
| 2004/0192430 A1 | 9/2004 | Burak et al. | |
| 2004/0223299 A1 | 11/2004 | Ghosh | |
| 2005/0117294 A1 | 6/2005 | Hsieh | |
| 2005/0195277 A1* | 9/2005 | Yamasaki | H04N 21/84 |
| | | | 348/E5.025 |
| 2006/0028436 A1 | 2/2006 | Armstrong | |
| 2006/0087815 A1 | 4/2006 | Lanni | |
| 2006/0109200 A1 | 5/2006 | Alden | |
| 2006/0132497 A1 | 6/2006 | Biegelsen | |
| 2007/0081123 A1 | 4/2007 | Lewis | |
| 2007/0109787 A1 | 5/2007 | Wu | |
| 2007/0247832 A1 | 10/2007 | Barker | |
| 2008/0259539 A1 | 10/2008 | Iwata et al. | |
| 2009/0136341 A1 | 5/2009 | Kenyon | |
| 2009/0290307 A1 | 11/2009 | Hwang et al. | |
| 2010/0003126 A1 | 1/2010 | Wang | |
| 2010/0097448 A1 | 4/2010 | Gilbert et al. | |
| 2010/0142146 A1 | 6/2010 | Hwang et al. | |
| 2010/0247344 A1 | 9/2010 | Yang | |
| 2010/0310390 A1 | 12/2010 | Huang et al. | |
| 2011/0046812 A1 | 2/2011 | Hansen et al. | |
| 2011/0063799 A1 | 3/2011 | Takahasi et al. | |
| 2011/0157168 A1 | 6/2011 | Bennett et al. | |
| 2011/0194029 A1* | 8/2011 | Herrmann | H04N 13/398 |
| | | | 348/569 |
| 2011/0194223 A1 | 8/2011 | Kang et al. | |
| 2011/0228477 A1 | 9/2011 | Hong | |
| 2011/0263200 A1 | 10/2011 | Thornton et al. | |
| 2012/0127062 A1 | 5/2012 | Bar-Zeev et al. | |
| 2012/0162549 A1 | 6/2012 | Gao et al. | |
| 2013/0017076 A1 | 1/2013 | Li | |
| 2013/0044129 A1 | 2/2013 | Latta et al. | |
| 2013/0082922 A1 | 4/2013 | Miller | |
| 2013/0117377 A1 | 5/2013 | Miller | |
| 2013/0125027 A1 | 5/2013 | Abovitz | |
| 2013/0208234 A1 | 8/2013 | Lewis | |
| 2013/0242262 A1 | 9/2013 | Lewis | |
| 2013/0292481 A1 | 11/2013 | Filson et al. | |
| 2013/0321394 A1 | 12/2013 | Fisher et al. | |
| 2014/0002750 A1 | 1/2014 | Hamada | |
| 2014/0071539 A1 | 3/2014 | Gao | |
| 2014/0143934 A1* | 5/2014 | Grzybowski | A42B 3/286 |
| | | | 2/171.3 |
| 2014/0152672 A1 | 6/2014 | Seder et al. | |
| 2014/0168266 A1* | 6/2014 | Kimura | G06F 3/011 |
| | | | 345/633 |
| 2014/0168783 A1 | 6/2014 | Luebke et al. | |
| 2014/0177023 A1 | 6/2014 | Gao et al. | |
| 2014/0218468 A1 | 8/2014 | Gao et al. | |
| 2014/0267420 A1 | 9/2014 | Schowengerdt et al. | |
| 2014/0294621 A1 | 10/2014 | Narita | |
| 2014/0306866 A1 | 10/2014 | Miller et al. | |

(56) References Cited

U.S. PATENT DOCUMENTS

| | | |
|---|---|---|
| 2015/0016777 A1 | 1/2015 | Abovitz et al. |
| 2015/0029661 A1 | 1/2015 | Huang et al. |
| 2015/0049390 A1 | 2/2015 | Lanman et al. |
| 2015/0103306 A1 | 4/2015 | Kaji et al. |
| 2015/0115060 A1 | 4/2015 | Klemm et al. |
| 2015/0116928 A1 | 4/2015 | Delano et al. |
| 2015/0178939 A1 | 6/2015 | Bradski et al. |
| 2015/0205126 A1 | 7/2015 | Schowengerdt |
| 2015/0222883 A1 | 8/2015 | Welch |
| 2015/0222884 A1 | 8/2015 | Cheng |
| 2015/0238141 A1 | 8/2015 | Lai |
| 2015/0260990 A1 | 9/2015 | Ueno et al. |
| 2015/0268415 A1 | 9/2015 | Schowengerdt et al. |
| 2015/0302652 A1 | 10/2015 | Miller et al. |
| 2015/0309263 A2 | 10/2015 | Abovitz et al. |
| 2015/0326570 A1 | 11/2015 | Publicover et al. |
| 2015/0346490 A1 | 12/2015 | Tekolste et al. |
| 2015/0346495 A1 | 12/2015 | Welch et al. |
| 2015/0351280 A1 | 12/2015 | Gonzalez Inda et al. |
| 2015/0379770 A1 | 12/2015 | Haley, Jr. et al. |
| 2016/0011419 A1 | 1/2016 | Gao |
| 2016/0026156 A1 | 1/2016 | Jackson et al. |
| 2016/0026253 A1 | 1/2016 | Bradski et al. |
| 2016/0128229 A1 | 5/2016 | Pallasmaa et al. |
| 2016/0255748 A1 | 9/2016 | Kim et al. |
| 2016/0269067 A1 | 9/2016 | Pidwerbecki et al. |
| 2016/0270656 A1 | 9/2016 | Samec et al. |
| 2016/0298650 A1 | 10/2016 | Inda et al. |
| 2017/0094835 A1 | 3/2017 | Prather et al. |
| 2017/0106277 A1 | 4/2017 | Perdigón Rodriguez et al. |
| 2017/0223344 A1 | 8/2017 | Kaehler |
| 2017/0235134 A1 | 8/2017 | Border et al. |
| 2017/0257913 A1 | 9/2017 | Vengroff et al. |
| 2017/0347498 A1 | 11/2017 | Janak et al. |
| 2018/0003192 A1 | 1/2018 | Chen et al. |
| 2018/0036703 A1 | 2/2018 | Mercer et al. |
| 2018/0053284 A1 | 2/2018 | Rodriguez et al. |
| 2018/0136703 A1 | 5/2018 | Woods et al. |
| 2018/0217379 A1* | 8/2018 | Nishizawa ............... G06F 3/011 |
| 2018/0232021 A1 | 8/2018 | Perchlik et al. |
| 2018/0249025 A1 | 8/2018 | Nakayama et al. |
| 2018/0285923 A1 | 10/2018 | Fateh |
| 2018/0348826 A1 | 12/2018 | Aguirre et al. |
| 2018/0348828 A1 | 12/2018 | Cavallaro et al. |
| 2019/0035317 A1 | 1/2019 | Rohena et al. |
| 2020/0033921 A1 | 1/2020 | Rohena et al. |
| 2020/0092538 A1 | 3/2020 | Kaehler |
| 2020/0201402 A1 | 6/2020 | Lee et al. |
| 2020/0383240 A1 | 12/2020 | Rohena et al. |

FOREIGN PATENT DOCUMENTS

| | | |
|---|---|---|
| CN | 204945946 U | 1/2016 |
| CN | 207609586 U | 7/2018 |
| CN | 106358419 B | 5/2019 |
| CN | 209638039 U | 11/2019 |
| JP | 3070325 U | 7/2000 |
| JP | 2001308999 A | 11/2001 |
| JP | 2003216071 A | 7/2003 |
| JP | 2003244296 A | 8/2003 |
| JP | 2005308980 A | 11/2005 |
| JP | 2007194872 A | 8/2007 |
| JP | 2007226013 A | 9/2007 |
| JP | 2009071516 A | 4/2009 |
| JP | 2012168446 A | 9/2012 |
| JP | 2013064996 A | 4/2013 |
| WO | WO 2013086046 A1 | 6/2013 |
| WO | WO 2015140578 A1 | 9/2015 |
| WO | WO 2016170717 A1 | 10/2016 |
| WO | WO 2017132050 A1 | 8/2017 |
| WO | WO 2018222618 A1 | 12/2018 |
| WO | WO 2019023489 A1 | 1/2019 |

OTHER PUBLICATIONS

ARToolKit: https://web.archive.org/web/20051013062315/http://www.hitl.washington.edu:80/artoolkit/documentation/hardware.htm, archived Oct. 13, 2005.

Azuma, "A Survey of Augmented Reality," Teleoperators and Virtual Environments 6, Aug. 4, 1997, pp. 355-385. <https://web.archive.org/web/20010604100006/http://www.cs.unc.edu/~azuma/ARpresence.pdf>.

Azuma, "Predictive Tracking for Augmented Realty," TR95-007, Department of Computer Science, UNC-Chapel Hill, NC, Feb. 1995.

Bimber, et al., "Spatial Augmented Reality—Merging Real and Virtual Worlds," 2005 <https://web.media.mit.edu/~raskar/book/BimberRaskarAugmentedRealityBook.pdf>.

International Preliminary Report on Patentability, dated Dec. 3, 2019, for International Patent Application No. PCT/US2018/034948. (7 pages).

International Preliminary Report on Patentability, dated Jul. 31, 2018, for International Patent Application No. PCT/US2017/014166. (11 pages).

International Search Report and Written Opinion, dated Apr. 4, 2017, for International Patent Application No. PCT/US2017/014166. (12 pages).

International Search Report and Written Opinion, dated Oct. 17, 2018, for International Patent Application No. PCT/US2018/034948. (11 pages).

Invitation to Pay Additional Fees, dated Aug. 6, 2018, for International Patent Application No. PCT/US2018/34948.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Kino-mo, "Kino-mo Holo Displays—The new holograms," URL= https://kinomo.com/displays, retrieved Jan. 27, 2016. (4 pages).

Lanman et al., "Near-Eye Light Field Displays," NVIDIA Research, Jul. 2013. (10 pages).

Tanriverdi et al., "Interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

* cited by examiner

POWER SUPPLY ASSEMBLY WITH FAN ASSEMBLY FOR ELECTRONIC DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 C.F.R. § 1.57.

BACKGROUND

Field

The field relates to a power supply assembly with fan assembly for electronic devices, and in particularly, for portable electronic devices.

Description of the Related Art

In various types of portable electronic devices, it can be challenging to sufficiently dissipate heat that is generated by on-board electronics and/or the power supply (e.g., batteries). Moreover, some thermal dissipation components may experience high mechanical loading conditions that can cause cyclic or other mechanical stresses and/or failure. It can be desirable to improve the dissipation of heat in electronic devices, and/or to improve the mechanical performance of such devices.

For example, in some embodiments, modern computing and display technologies have facilitated the development of systems for virtual reality and/or augmented reality experiences, wherein digitally reproduced images or portions thereof are presented to a user in a manner wherein they seem to be, or may be perceived to be, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user.

Some VR or AR systems may include portable electronic devices that may be subject to the thermal and/or mechanical loads. Accordingly, there remains a continuing need for improved thermal and/or mechanical solutions for portable electronic devices, including those used in conjunction with VR or AR systems.

SUMMARY

In some embodiments, an electronic device is disclosed. The electronic device can comprise a housing comprising a first compartment in which a first electronic component is disposed. The housing can comprise a second compartment in which a second electronic component is disposed, one or both of the first and second electrical components electrically communicating with another component of the electronic device. The housing can comprise a connection portion extending between the first and second compartments. The first compartment can separated from the second compartment at a location spaced away from the connection portion by a gap to provide thermal separation between the first and second electronic components In some embodiments, a portable electronic device is disclosed. The portable electronic device comprises a housing and a battery disposed in the housing, the battery supplying power for at least a portion of the portable electronic device. The portable electronic device comprises electronic components for operating the portable electronic device, the electronic components disposed in the housing. The portable electronic device comprises a thermal mitigation assembly comprising a frame assembly. The frame assembly can comprise a shaft assembly having a first end and a second end opposite the first end, the first and second ends supported by the frame assembly. The frame assembly can comprise an impeller having fan blades coupled with a hub, the hub being coupled with the shaft assembly for rotation within the housing about a longitudinal axis of the shaft assembly. Loading transverse to the longitudinal axis of the shaft assembly can be controlled by the frame assembly at the second end of the shaft assembly. The thermal mitigation assembly removes heat generated from one or both of the battery and the electronic components.

In some embodiments, the housing comprises a first enclosure and a second enclosure, the electronic components and the thermal mitigation assembly disposed in the first enclosure and the battery disposed in the second enclosure.

In some embodiments, a fan assembly is disclosed. The fan assembly can include a first support frame, a shaft assembly having a first end coupled with the first support frame and a second end disposed away from the first end, and a second support frame coupled with the first support frame and disposed at or over the second end of the shaft assembly. An impeller can have fan blades coupled with a hub, the hub being disposed over the shaft assembly for rotation between the first and second support frames about a longitudinal axis. Transverse loading on the shaft assembly can be controlled by the first and second support frames.

In some embodiments, the second support frame comprises an airflow opening disposed about the longitudinal axis which extends between the first and second ends of the shaft assembly. A shaft support can be coupled with the second end of the shaft assembly, the shaft support being rigidly attached to the second support frame across the airflow opening. The shaft support can be supported at respective first and second portions of the second support frame, the respective first and second portions spaced apart about a periphery of the airflow opening. The first portion of the second support frame is generally on an opposite side of the airflow opening relative to the second portion of the second support frame. The shaft support is disposed in a rotational position of the airflow opening corresponding to a maximum of air flow when the impeller is operating. The shaft support comprises an elongate member between first and second ends thereof, the elongate member having an airfoil shape. The shaft support comprises an elongate member between the first and second ends thereof, the elongate member having varying width along the length thereof. The shaft support comprises an elongate member between the first and second ends thereof, the elongate member having varying thickness along the length thereof. The shaft assembly comprises a first shaft portion rotationally fixed to the first support frame and a second portion rotationally fixed to the impeller, the second portion being rotatable over a free end of the first shaft portion of the shaft assembly. The shaft assembly comprises an elongate member having a first end disposed on a first side of the impeller and a second end disposed on a second side of the impeller, the second side being opposite the first side. A concave member can be coupled with the second support frame and configured to rotationally support the second end of the elongate member. An additional concave member can be coupled with the first support frame and configured to rotationally support the first end of the elongate member. An airflow pathway of the fan assembly extends between the airflow opening disposed about the longitudinal axis and a second airflow opening having a face disposed about an axis non-parallel to the longitudinal axis. The axis non-parallel to the longitudinal axis is disposed generally perpendicular to the longitudinal axis and along a radial-extending axis of the impeller.

A fan assembly can include an enclosure supporting a shaft assembly at a first end, the shaft having a second end opposite the first end, and an impeller having fan blades coupled with a hub, the hub being coupled with the shaft for rotation within the enclosure about a longitudinal axis. Transverse loading on the shaft assembly can be controlled by the enclosure at the second end of the shaft assembly.

A fan assembly can comprise a housing comprising a shaft support and a shaft assembly supported by the shaft support. An impeller can be disposed in the housing and coupled with the shaft assembly, the impeller configured to rotate about a longitudinal axis of the shaft assembly. A first airflow opening can be disposed about the longitudinal axis. A second airflow opening having a face can be disposed about an axis non-parallel to the longitudinal axis. An airflow pathway of the fan assembly can extend between the first airflow opening and the second airflow opening. The shaft support can comprise an elongate member extending across at least a portion of the first airflow opening, the elongate member angularly positioned across the first airflow opening at an angle relative to the non-parallel axis that permits at least a local maximum of airflow through the first airflow opening.

In some embodiments, the angle relative to the non-parallel axis is acute. In some embodiments, the angle relative to the non-parallel axis is in a range of −45° to 45°. In some embodiments, the angle relative to the non-parallel axis is in a range of −30° to 30°.

In some embodiments, a method of manufacturing a fan assembly is disclosed. The method can include providing a fan assembly comprising a housing and an impeller disposed in the housing and coupled with a shaft assembly, the impeller configured to rotate about a longitudinal axis of the shaft assembly. A first airflow opening can be disposed about the longitudinal axis. A second airflow opening having a face disposed about an axis non-parallel to the longitudinal axis, wherein an airflow pathway of the fan assembly extends between the first airflow opening and the second airflow opening. The method can include computing an airflow profile through the fan assembly, and based on the computing, providing a shaft support to support an end of the shaft assembly, the shaft support comprising an elongate member extending across at least a portion of the first airflow opening.

In some embodiments, based on the computing, the method can comprise angularly positioning the elongate member at least partially across the first airflow opening at an angle relative to the non-parallel axis that permits at least a local maximum of airflow through the first airflow opening. In some embodiments, angularly positioning comprises orienting the angle relative to the non-parallel axis at an acute angle. In some embodiments, angularly positioning comprises orienting the angle relative to the non-parallel axis in a range of −45° to 45°. In some embodiments, angularly positioning comprises orienting the angle relative to the non-parallel axis in a range of −30° to 30°.

Details of one or more implementations of the subject matter described in this specification are set forth in the accompanying drawings and the description below. Other features, aspects, and advantages will become apparent from the description, the drawings, and the claims. Neither this summary nor the following detailed description purports to define or limit the scope of the inventive subject matter.

Throughout the drawings, reference numbers may be re-used to indicate correspondence between referenced elements. The drawings are provided to illustrate example embodiments described herein and are not intended to limit the scope of the disclosure.

DETAILED DESCRIPTION

Figure 1:
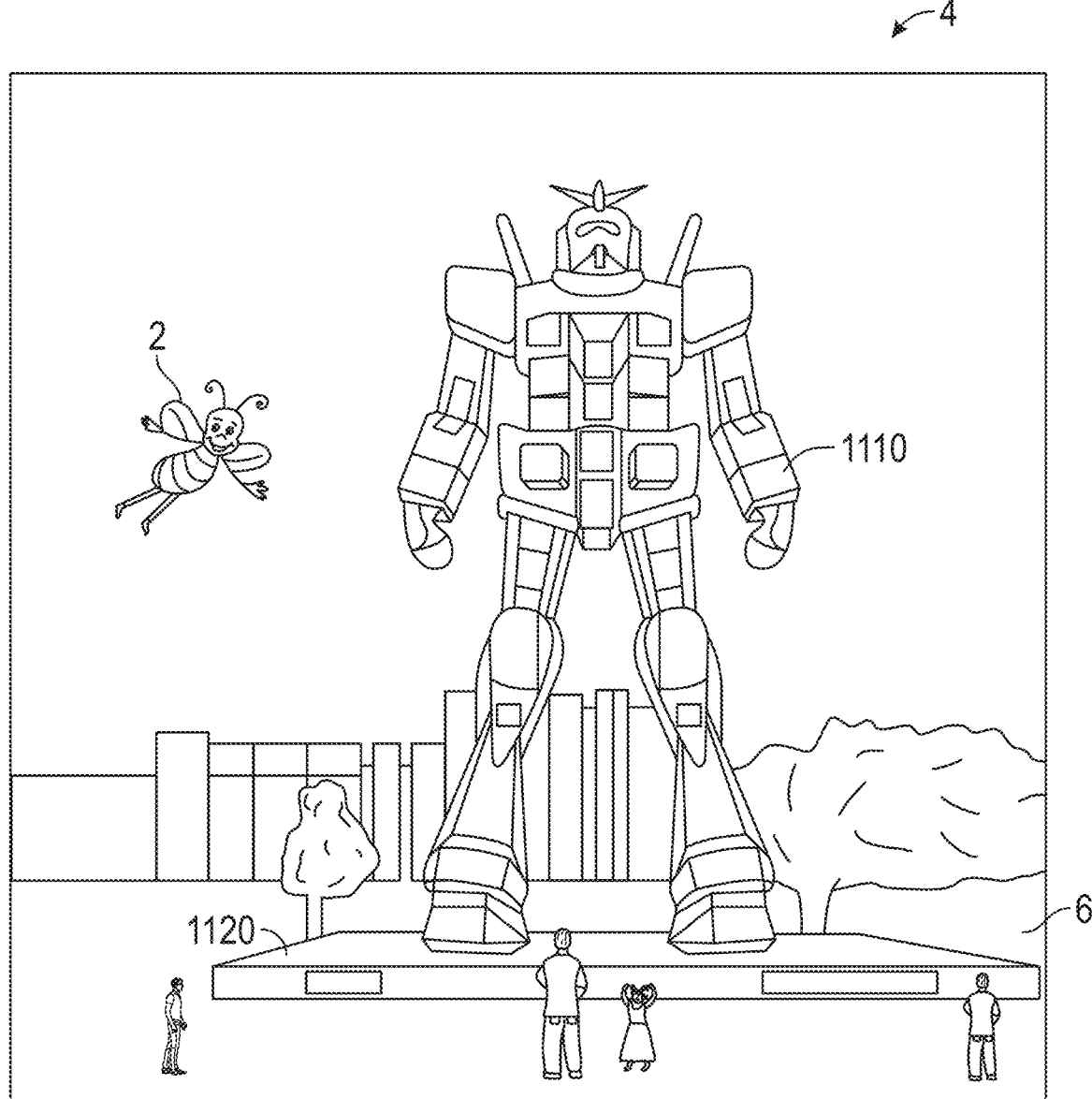
FIG. 1 depicts an illustration of an augmented reality scenario with certain virtual reality objects, and certain physical objects viewed by a person.

Various embodiments disclosed herein relate to a portable (e.g., wearable) electronic device. For example, in FIG. 1 an augmented reality scene 4 is depicted wherein a user of an AR technology sees a real-world park-like setting 6 featuring people, trees, buildings in the background, and a concrete platform 1120. In addition to these items, the user of the AR technology also perceives that he "sees" a robot statue 1110 standing upon the real-world platform 1120, and a cartoon-like avatar character 2 flying by which seems to be a personification of a bumble bee, even though these elements 2, 1110 do not exist in the real world. At least the elements 2, 1110 can be provided to the user at least in part by the portable (e.g., wearable) electronic devices disclosed herein. As it turns out, the human visual perception system is very complex, and producing a VR or AR technology that facilitates a comfortable, natural-feeling, rich presentation of virtual image elements amongst other virtual or real-world imagery elements is challenging.

For instance, head-worn AR displays (or helmet-mounted displays, or smart glasses) typically are at least loosely coupled to a user's head, and thus move when the user's head moves. If the user's head motions are detected by the display system, the data being displayed can be updated to take the change in head pose into account.

As an example, if a user wearing a head-worn display views a virtual representation of a three-dimensional (3D) object on the display and walks around the area where the 3D object appears, that 3D object can be re-rendered for each viewpoint, giving the user the perception that he or she is walking around an object that occupies real space. If the head-worn display is used to present multiple objects within a virtual space (for instance, a rich virtual world), measurements of head pose (e.g., the location and orientation of the user's head) can be used to re-render the scene to match the user's dynamically changing head location and orientation and provide an increased sense of immersion in the virtual space.

In AR systems, detection or calculation of head pose can facilitate the display system to render virtual objects such that they appear to occupy a space in the real world in a manner that makes sense to the user. In addition, detection of the position and/or orientation of a real object, such as handheld device (which also may be referred to as a "totem"), haptic device, or other real physical object, in relation to the user's head or AR system may also facilitate the display system in presenting display information to the user to enable the user to interact with certain aspects of the AR system efficiently. As the user's head moves around in the real world, the virtual objects may be re-rendered as a function of head pose, such that the virtual objects appear to remain stable relative to the real world. At least for AR applications, placement of virtual objects in spatial relation to physical objects (e.g., presented to appear spatially proximate a physical object in two- or three-dimensions) may be a non-trivial problem. For example, head movement may significantly complicate placement of virtual objects in a view of an ambient environment. Such is true whether the view is captured as an image of the ambient environment and then projected or displayed to the end user, or whether the end user perceives the view of the ambient environment directly. For instance, head movement will likely cause a field of view of the end user to change, which will likely require an update to where various virtual objects are displayed in the field of the view of the end user. Additionally, head movements may occur within a large variety of ranges and speeds. Head movement speed may vary not only between different head movements, but within or across the range of a single head movement. For instance, head movement speed may initially increase (e.g., linearly or not) from a starting point, and may decrease as an ending point is reached, obtaining a maximum speed somewhere between the starting and ending points of the head movement. Rapid head movements may even exceed the ability of the particular display or projection technology to render images that appear uniform and/or as smooth motion to the end user.

Head tracking accuracy and latency (e.g., the elapsed time between when the user moves his or her head and the time when the image gets updated and displayed to the user) have been challenges for VR and AR systems. Especially for display systems that fill a substantial portion of the user's visual field with virtual elements, it is advantageous if the accuracy of head-tracking is high and that the overall system latency is very low from the first detection of head motion to the updating of the light that is delivered by the display to the user's visual system. If the latency is high, the system can create a mismatch between the user's vestibular and visual sensory systems, and generate a user perception scenario that can lead to motion sickness or simulator sickness. If the system latency is high, the apparent location of virtual objects will appear unstable during rapid head motions.

In addition to head-worn display systems, other display systems can benefit from accurate and low latency head pose detection. These include head-tracked display systems in which the display is not worn on the user's body, but is, e.g., mounted on a wall or other surface. The head-tracked display acts like a window onto a scene, and as a user moves his head relative to the "window" the scene is re-rendered to match the user's changing viewpoint. Other systems include a head-worn projection system, in which a head-worn display projects light onto the real world.

Additionally, in order to provide a realistic augmented reality experience, AR systems may be designed to be interactive with the user. For example, multiple users may play a ball game with a virtual ball and/or other virtual objects. One user may "catch" the virtual ball, and throw the ball back to another user. In another embodiment, a first user may be provided with a totem (e.g., a real bat communicatively coupled to the AR system) to hit the virtual ball. In other embodiments, a virtual user interface may be presented to the AR user to allow the user to select one of many options. The user may use totems, haptic devices, wearable components, or simply touch the virtual screen to interact with the system.

Detecting head pose and orientation of the user, and detecting a physical location of real objects in space enable the AR system to display virtual content in an effective and enjoyable manner. However, although these capabilities are key to an AR system, but are difficult to achieve. In other words, the AR system can recognize a physical location of a real object (e.g., user's head, totem, haptic device, wearable component, user's hand, etc.) and correlate the physical coordinates of the real object to virtual coordinates corresponding to one or more virtual objects being displayed to the user. This generally requires highly accurate sensors and sensor recognition systems that track a position and orientation of one or more objects at rapid rates. Current approaches do not perform localization at satisfactory speed or precision standards.

Thus, there is a need for a better localization system in the context of AR and VR devices. Moreover, the continual and/or rapid movement of users can introduce various other problems into the electrical, thermal, and/or mechanical systems of such AR and/VR devices.

Referring to FIGS. 2A-2D, some general componentry options are illustrated. In the portions of the detailed description which follow the discussion of FIGS. 2A-2D, various systems, subsystems, and components are presented for addressing the objectives of providing a high-quality, comfortably-perceived display system for human VR and/or AR.

Figure 2A:
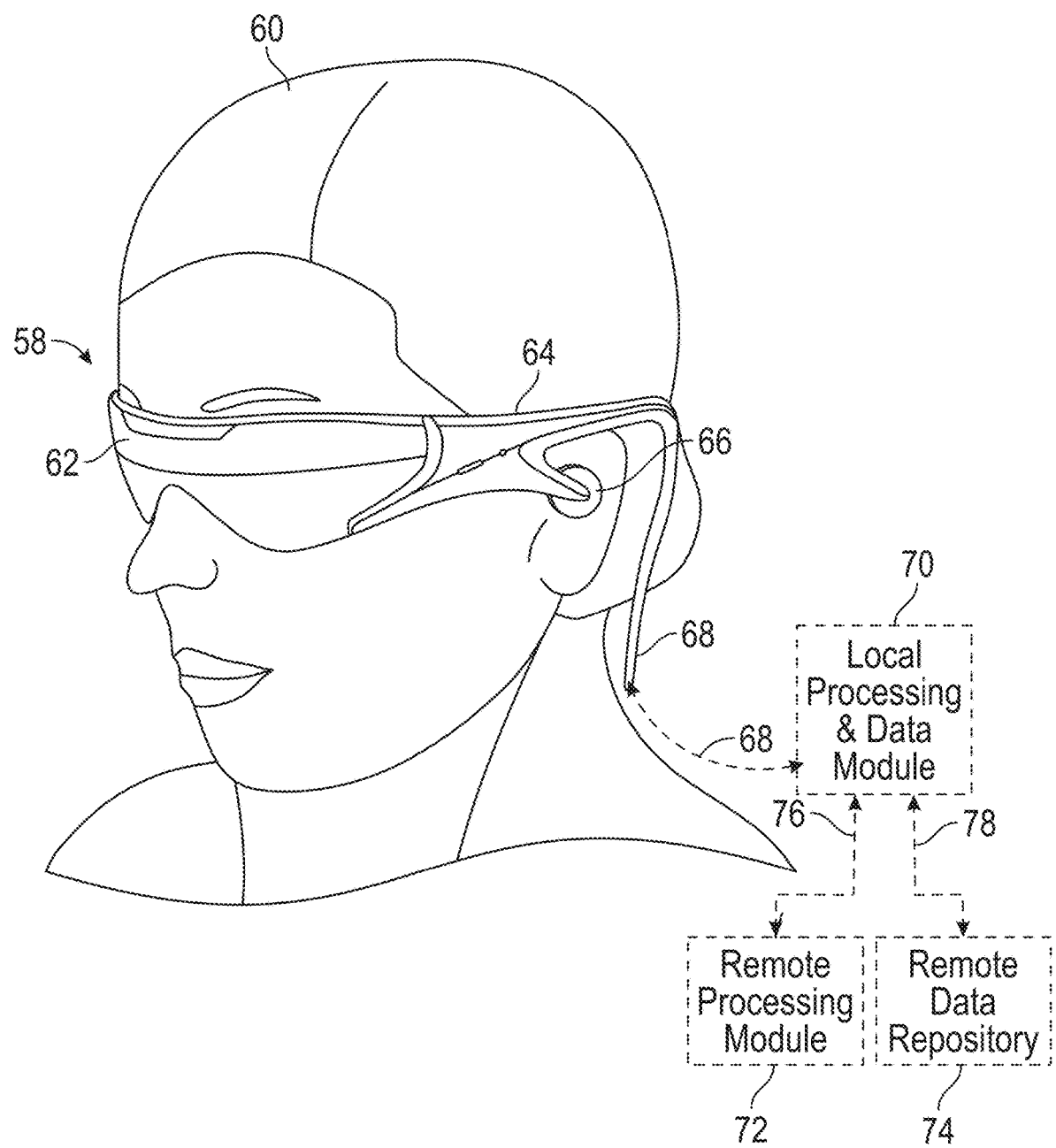
FIGS. 2A-2D schematically illustrate examples of a wearable system, according to various embodiments.
Figure 2B:
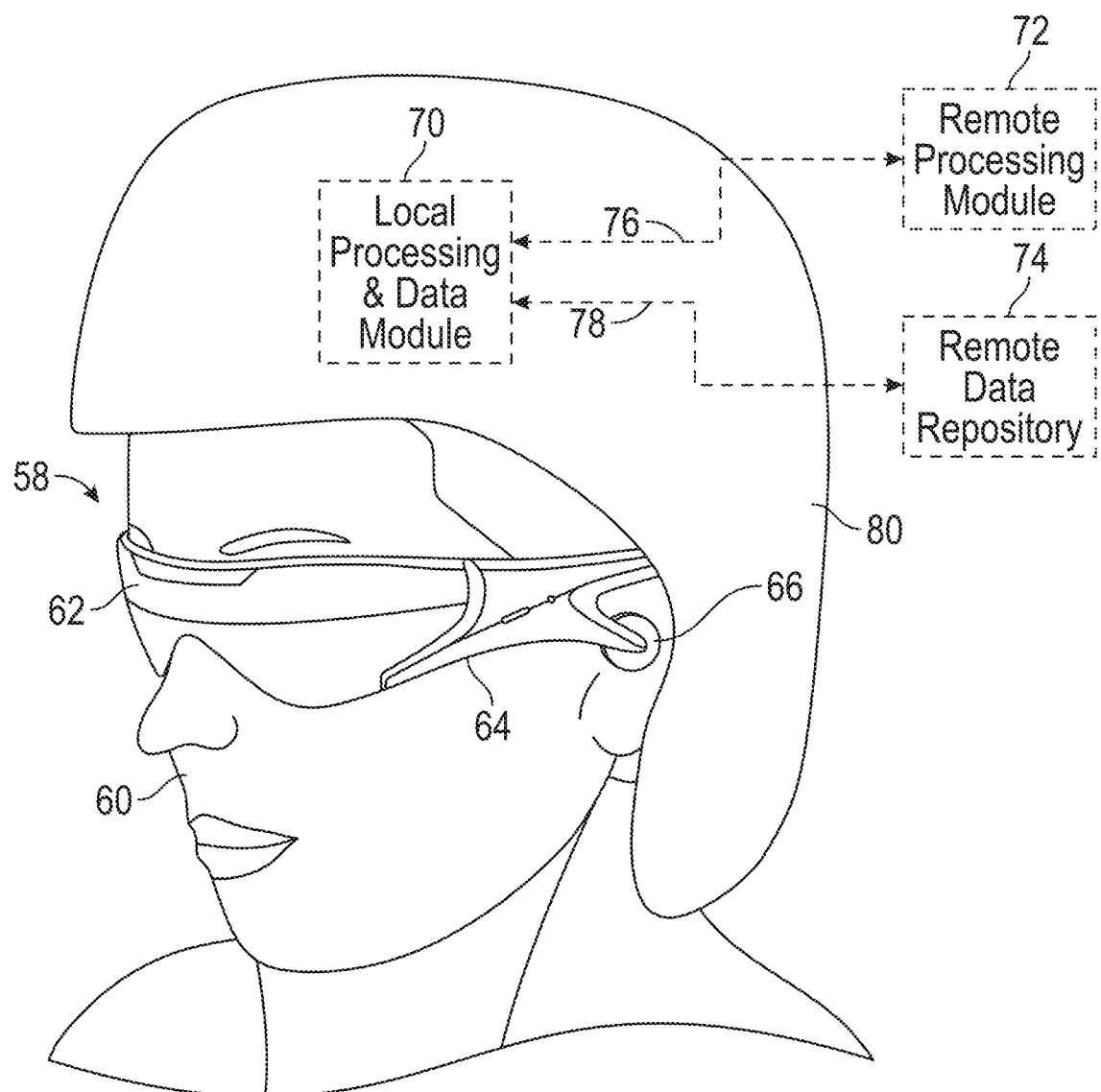
Figure 2C:
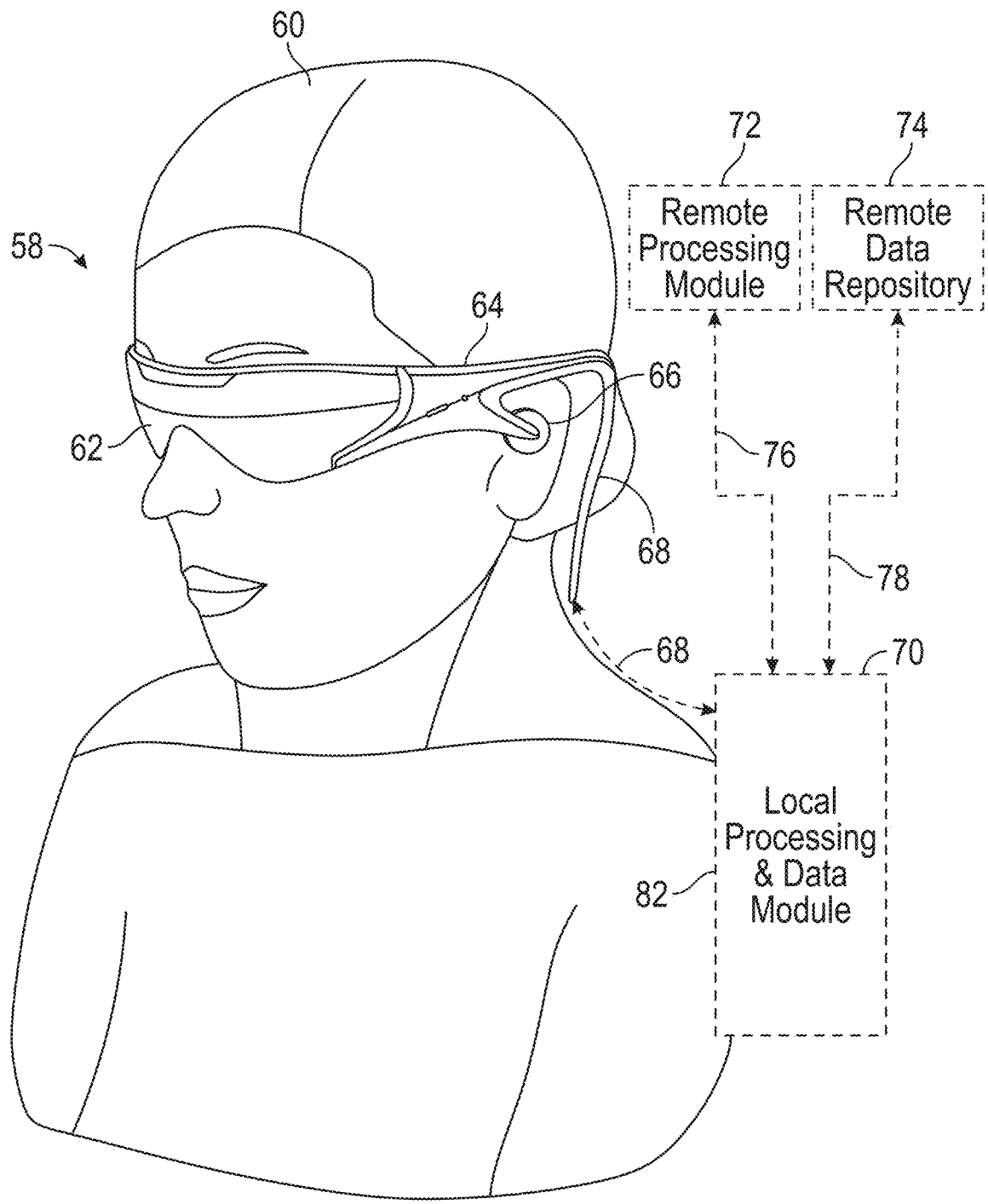
Figure 2D:
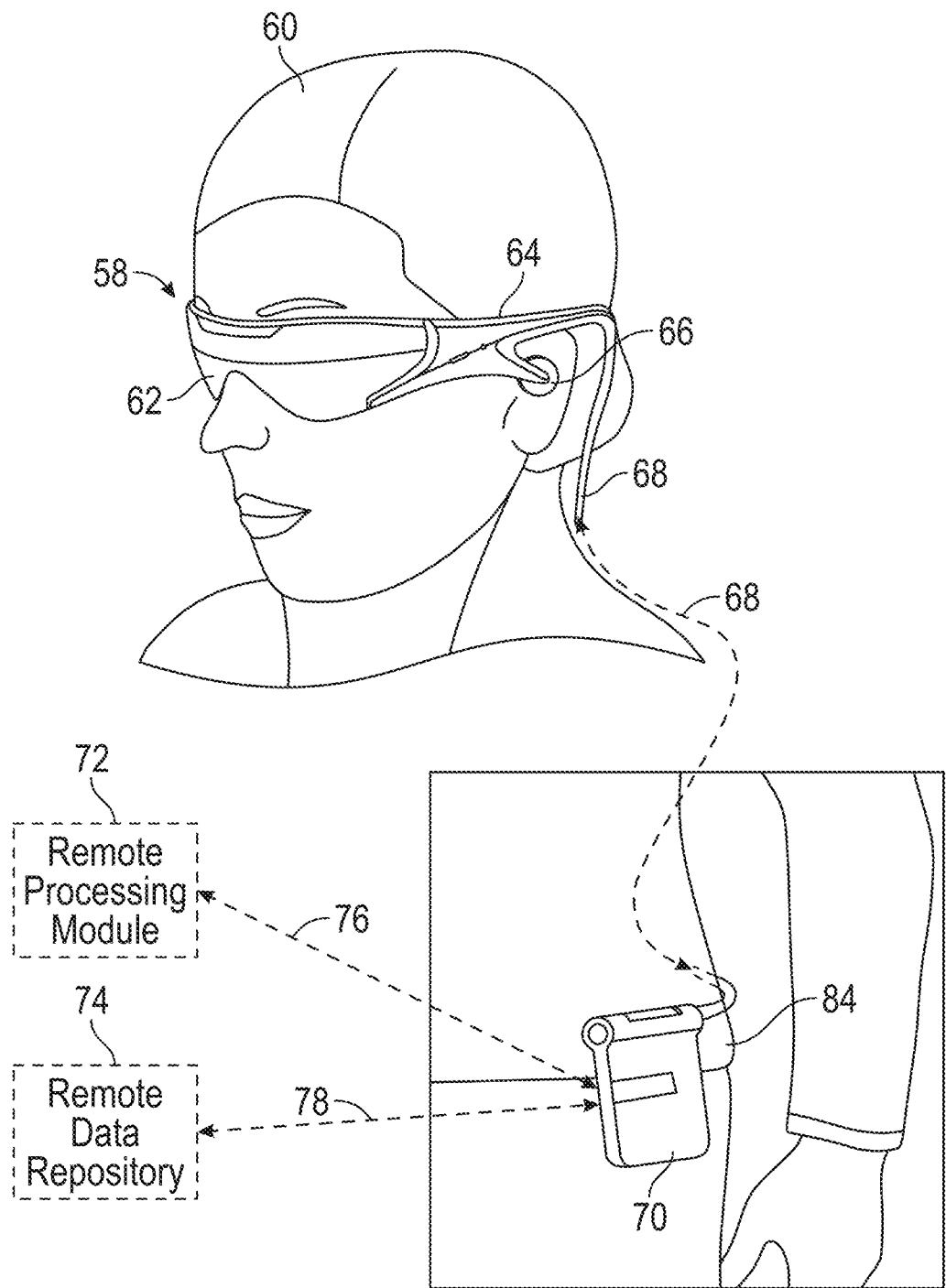

As shown in FIG. 2A, an AR system user 60 is depicted wearing head mounted component 58 featuring a frame 64 structure coupled to a display system 62 positioned in front of the eyes of the user. A speaker 66 is coupled to the frame 64 in the depicted configuration and positioned adjacent the ear canal of the user (in one embodiment, another speaker, not shown, is positioned adjacent the other ear canal of the user to provide for stereo/shapeable sound control). The display 62 is operatively coupled 68, such as by a wired lead or wireless connectivity, to a local processing and data module 70 which may be mounted in a variety of configurations, such as fixedly attached to the frame 64, fixedly attached to a helmet or hat 80 as shown in the embodiment of FIG. 2B, embedded in headphones, removably attached to the torso 82 of the user 60 in a backpack-style configuration as shown in the embodiment of FIG. 2C, or removably attached to the hip 84 of the user 60 in a belt-coupling style configuration as shown in the embodiment of FIG. 2D.

The local processing and data module 70 may comprise a power-efficient processor or controller, as well as digital memory, such as flash memory, both of which may be utilized to assist in the processing, caching, and storage of data a) captured from sensors which may be operatively coupled to the frame 64, such as image capture devices (such as cameras), microphones, inertial measurement units, accelerometers, compasses, GPS units, radio devices, and/or gyros; and/or b) acquired and/or processed using the remote processing module 72 and/or remote data repository 74, possibly for passage to the display 62 after such processing or retrieval. The local processing and data module 70 may be operatively coupled 76, 78, such as via a wired or wireless communication links, to the remote processing module 72 and remote data repository 74 such that these remote modules 72, 74 are operatively coupled to each other and available as resources to the local processing and data module 70.

In one embodiment, the remote processing module 72 may comprise one or more relatively powerful processors or controllers configured to analyze and process data and/or image information. In one embodiment, the remote data repository 74 may comprise a relatively large-scale digital data storage facility, which may be available through the internet or other networking configuration in a "cloud" resource configuration. In one embodiment, all data is stored and all computation is performed in the local processing and data module, allowing fully autonomous use from any remote modules.

Thermal Mitigation in Local Processing and Data Module

Figure 3A:
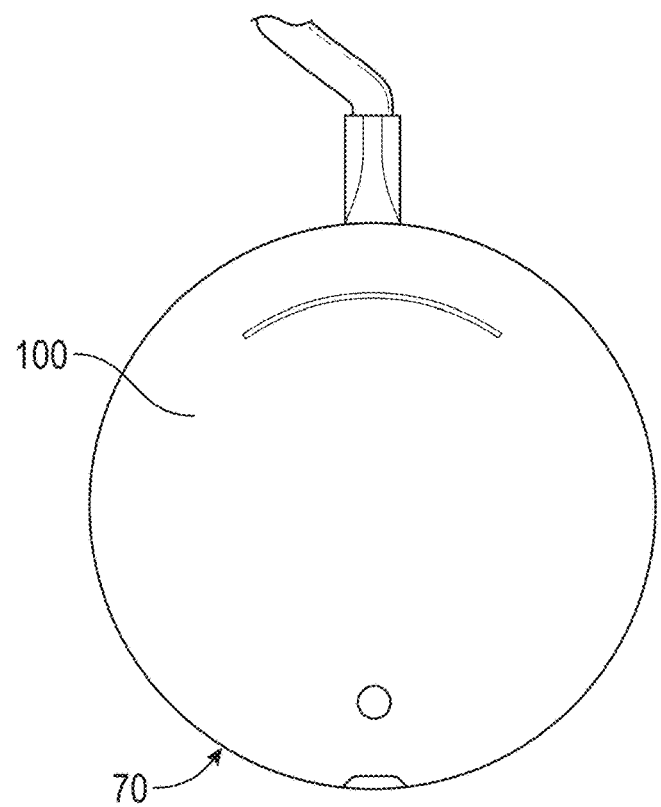
FIG. 3A is a schematic front plan view of a portion of a portable electronic device that can comprise part of a wearable system comprising a local processing and data module, according to one embodiment.
Figure 3B:
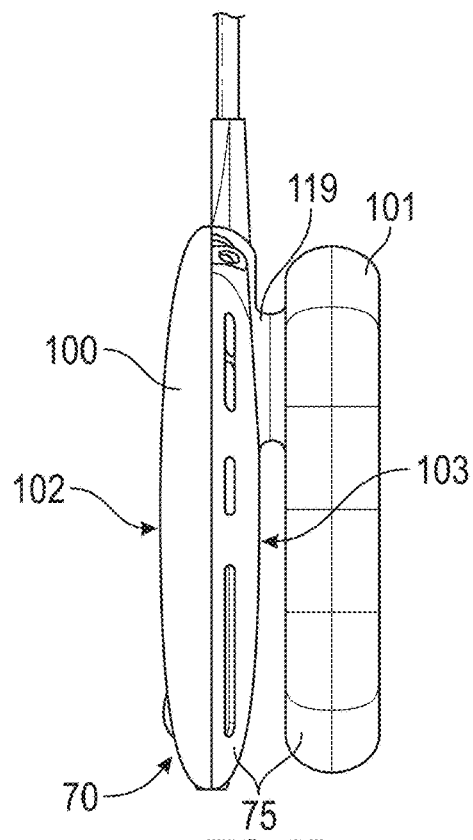
FIG. 3B is a schematic right side view of the local processing and data module of FIG. 3A.

FIG. 3A is a schematic front plan view of the local processing and data module 70, according to one embodiment. FIG. 3B is a schematic right side view of the local processing and data module 70 of FIG. 3A. As shown in FIGS. 3A and 3B, the local processing and data module 70 can comprise a housing 75 comprising a first enclosure 100 and a second enclosure 101 mechanically connected with the first enclosure 100. The second enclosure 101 can be fluidly coupled with the first enclosure 100 in some embodiments. The first enclosure 100 and the second enclosure 101 are coupled to provide thermal isolation or separation therebetween, e.g., a gap (such as an air gap) between the enclosures 100, 101 can provide improved thermal isolation therebetween. Thus, in some embodiments, the first enclosure can comprise a first compartment separated from a second compartment of the second enclosure 101 at a location spaced away from the first compartment by a gap that provides thermal separation between the first and second enclosures 100, 101. As discussed further below, however, in various embodiments at least some heat generated in the second enclosure 101 can flow to the first enclosure 100.

The first enclosure 100 can comprise a front side 102 and a back side 103 opposite the front side 102. The second enclosure 101 can be coupled with the back side 103 of the first enclosure. A connection portion comprising a channel 119 can extend between the first and second enclosures 100, 101. The channel 119 of the connection portion can connect an internal chamber or cavity defined within the first enclosure 100 with an internal chamber or cavity defined within the second enclosures 101. As explained herein, in some embodiments, the channel 119 can be sized to accommodate one or more electrical connectors extending between components within the first and second enclosures 100, 101. Moreover, the channel 119 can provide heat transfer by fluid communication or other means between the first and second enclosures 100, 101, e.g., to improve heat dissipation within the housing 75. In other embodiments, as explained herein, the channel 119 of the connection portion (and/or a physical air gap separating the enclosures 100, 101) can provide a thermal gap between the first and second enclosures 100, 101 to provide thermal separation between the enclosures 100, 101. In the embodiment of FIGS. 3A-3B, each enclosure 100, 101 can comprise a disc-shaped structure having an internal chamber or cavity shaped to contain various electronic devices, thermal mitigation features, and/or power supply devices. In other embodiments, the enclosures 100, 101 can be shaped differently.

Figure 3C:
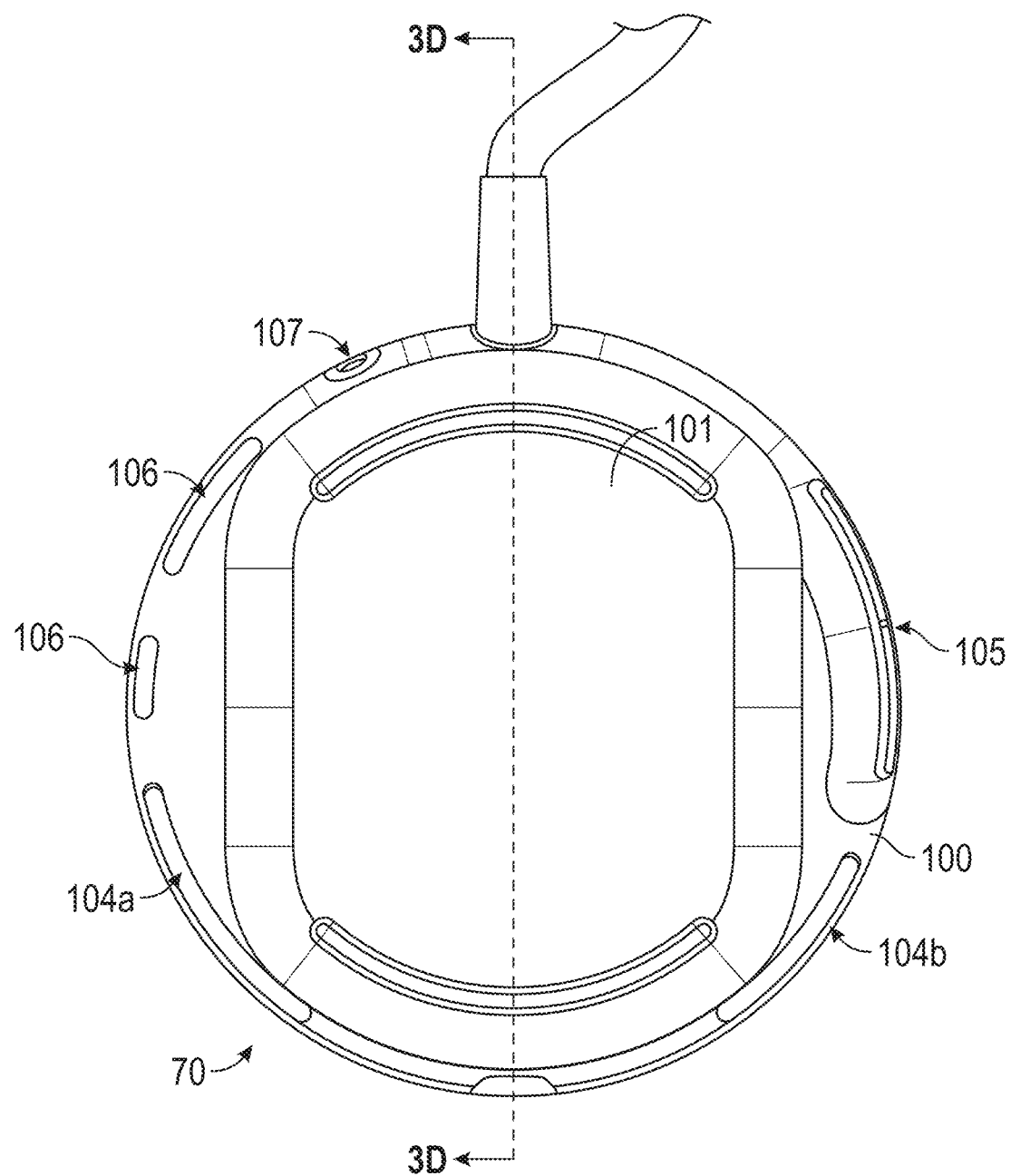
FIG. 3C is a schematic rear plan view of the local processing and data module shown in FIGS. 3A-3B.

FIG. 3C is a schematic rear plan view of the local processing and data module 70 shown in FIGS. 3A-3B. As shown in FIG. 3C, the housing 75 (e.g., on a periphery of the first enclosure 100) can include one or a plurality of user interfaces 106 configured to enable the user to control the operation of the system. For example, in some embodiments, the user interfaces 106 can comprise buttons or other types of interfaces to control the volume of the AR or VR experience, and/or to mute the volume. Other control mechanisms are possible through the interfaces 106. In addition, the local processing and data module 70 can include one or more input/output (I/O) ports 107 to provide input and/or output data. For example, the I/O port(s) 107 can comprise an audio port.

Also, the local processing and data module 70 can comprise one or more inlet ports 104a, 104b configured to permit gas (e.g., air) to enter the housing 75, e.g., at a position on a periphery of the first enclosure 100. The local processing and data module 70 can also include one or more exhaust ports 105 to permit the gas (e.g., air) to exit the housing 75, e.g., at a position on a periphery of the first enclosure 100. Thus, air can flow into the enclosure 100 through the inlet ports 104a, 104b, and can exit the enclosure 100 through the exhaust port(s) 105. The ports 104a, 104b, can include one or an array of holes in the enclosure 100 at spaced apart locations on the periphery of the enclosure 100. The ports 105 can include one or an array of holes in the enclosure 100. As discussed further below, one fan outlet is provided in some embodiments and in such embodiments a single ports 105 can be provided for fluid communication out of the housing 100. The ports 105 can be disposed on multiple peripheral sides of the enclosure 100 in some embodiments. The ports 104 can be disposed on multiple peripheral sides of the enclosure 100. As explained herein, the airflow through the enclosure 100 can beneficially carry heat away from the local processing and data module 70.

Figure 3D:
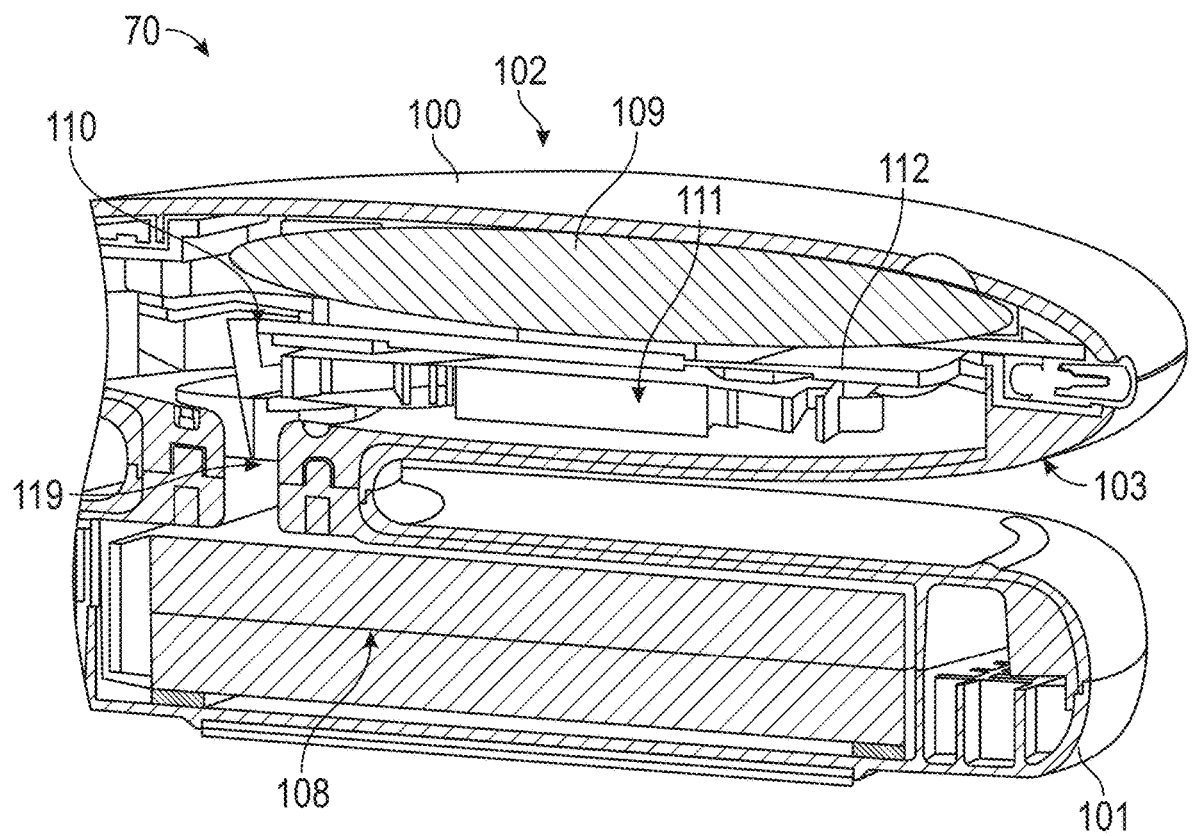
FIG. 3D is a schematic side cross-sectional view of the local processing and data module shown in FIGS. 3A-3C.

FIG. 3D is a schematic side cross-sectional view of the local processing and data module 70 shown in FIGS. 3A-3C. As explained above, the local processing and data module 70 may include one or multiple electronic components 109 (illustrated schematically herein in block form), such as processors, memory dies, sensors, etc. In the embodiment of FIG. 3D, the electronic components 109 can be disposed within a chamber or first compartment of the first enclosure 100 of the housing. As shown, the electronic components 109 can be arranged within a relatively low profile and a relatively small lateral footprint. The illustrated electronic components 109 are shown at or near the front side 102 of the first enclosure 100, but it should be appreciated that additional electronic components may be provided anywhere suitable in the enclosures 100, 101.

Incorporating multiple electronic components 109 within the enclosure 100 may generate substantial heat, which if not adequately cooled, may be uncomfortable to the user and/or may damage system components. Accordingly, in various embodiments, a thermal mitigation assembly 110 can be provided in the housing (e.g., in the first enclosure 100) to remove heat generated by the electronic components 109 and to maintain the temperature of the housing at comfortable and/or effective levels during operation. In the illustrated embodiment, the thermal mitigation assembly 110 is disposed rear of the electronic components 109. In the view depicted in FIG. 3D, the thermal mitigation assembly 110 can comprise a first heat spreader 112 disposed on a first side of a fan assembly 111. The first heat spreader 112 can be disposed on a front side of the fan assembly 111 and thus is sometimes a front heat spreader. As explained herein, the first heat spreader 112 can be mechanically and thermally coupled with the electronic components 109, so as to thermally conduct heat to a heat sink discussed below or components of the fan assembly 111. The fan assembly 111 can blow or draw air near or over the heat spreader 112 to expel a heat transfer medium (e.g., the heated air or other heated gas) out of the local processing and data module 70 through the exhaust port 105.

The local processing and data module 70 may also include additional electronic components (e.g., an on-board power supply module 118) within the second enclosure 101 to provide power to the electronic components 109 in the first enclosure 100 such that the user need not be tethered to a wired power supply. The power supply 118 shown in FIG. 3D can, for example, include one or a plurality of batteries. The on-board power supply may generate additional heat within the local processing and data module 70. In some embodiments, the fan assembly 111 can draw a heat transfer medium (e.g., heated air or other heated gas) from the second enclosure 101 into the first enclosure 100, e.g., by way of the channel 119 that provides fluid communication between the enclosures 100, 101. Thus, in various embodiments, the thermal mitigation assembly 110 can be configured to remove heat that is generated from one or both of the battery (e.g., the power supply 118) and the electronic components 109. In various embodiments, a majority of the heat removed from the local processing and data module 70 can comprise heat generated by the electronic components 109.

Figure 4A:
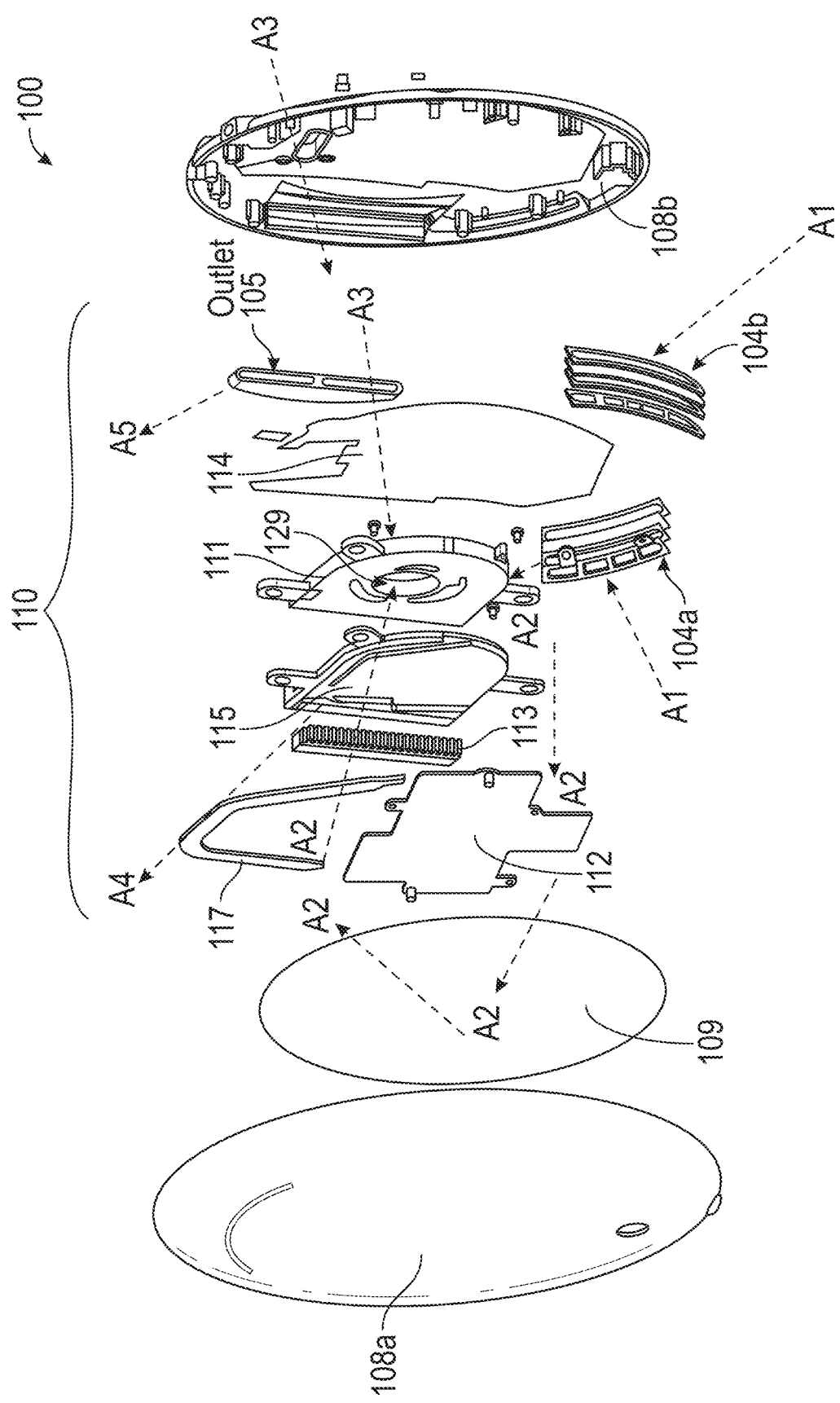
FIG. 4A is a schematic perspective, exploded view of a first enclosure of the local processing and data module, according to one embodiment.

FIG. 4A is a schematic perspective, exploded view of the first enclosure 100 of the local processing and data module 70, according to one embodiment. As explained above in connection with FIGS. 3A-3D, the electronics components 109 can be positioned within the enclosure 100 forward of the thermal mitigation assembly 110. The enclosure 100 can be structurally bounded or contained by connecting or mating a front cover 108a with a rear cover 108b. The front and rear covers 108a, 108b when connected define the chamber or first compartment in which the electronics components 109 and the thermal mitigation assembly 110 are disposed. Although FIG. 4A illustrates electronics components 109 and the thermal mitigation assembly 110 within the enclosure 100, it should be appreciated that additional components may be provided in the first enclosure 100.

As shown in FIG. 4A, the thermal mitigation assembly 110 can comprise a base 115 to support various components of the thermal mitigation assembly 110. For example, as shown in FIG. 4A, the first heat spreader 112 and a thermal conveyance pathway 117 (e.g., a heat pipe) can be mounted to or coupled with the base 115. In some embodiments, however, the assembly 110 may not include a base 115, such that the first heat spreader 122 and the thermal conveyance pathway 117 may be disposed adjacent to or otherwise connected to the fan assembly 111. In addition, a heat sink 113 (e.g., a finned stack of metallic plates or elements) can be mounted to or coupled with the base 115. For example, the heat sink 113 can comprise linked copper fin patterns, with each fin having a thickness in a range of 0.05 mm to 0.35 mm, e.g., in a range of 0.1 mm to 0.3 mm (about 0.2 mm in some embodiments). The fins can be spaced in a range of 0.25 mm to 2 mm, or in a range of 0.5 mm to 1.5 mm (about 1 mm in some embodiments). A second heat spreader 114 can be disposed on a second side of the fan assembly 111. The second heat spreader 114 can be disposed on a rear side of the fan assembly 111 and thus is sometimes a rear heat spreader. The first heat spreader 112 can be thermally and, optionally, mechanically coupled to some or all of the electronic components 109 by way of any suitable connector, such as a thermally conductive connector, a thermal gap pad, a thermal adhesive, etc. For example, in some embodiments, heat generated by the electronic components 109 may be conducted to the first heat spreader 112 by way of one or more thermal gap pads, which can comprise a thermally conductive elastomer. The thermal gap pads can generate pressure between the heat spreader 112 and the components so as to improve thermal conductivity. The heat can be conveyed from the heat spreader 112 and/or from the electronic components 109 along the thermal conveyance pathway 117 to the heat sink 113.

The fan assembly 111 can drive or draw air over and/or around the first heat spreader 112, the thermal conveyance pathway 117, and/or the second heat spreader 114 to cool the first enclosure 100 and/or the second enclosure 101. For example, influent air A1 can be drawn, by the fan assembly 111, into the first enclosure 100 by way of the inlet ports 104a, 104b. The fan assembly 111 can circulate cooling air A2 within the first enclosure 100 and over and/or around the electronic components 109 to cool the electronic components 109. The cooling air A2 may comprise ambient air drawn into the enclosure 100 without additional cooling in some embodiments. Moreover, as shown in FIG. 4A, the fan assembly 111 can draw cooling air A3 into the first enclosure 100 from the second enclosure 101, e.g., by way of the channel 119. Thus, in the illustrated embodiment, the electronic components 109 can be cooled by the cooling air A2 circulated within the enclosure 100.

In some embodiments, the battery or power supply 118 may also be cooled by way of the cooling air A3 drawn from the second enclosure 101 into the first enclosure 100. Heat from the second enclosure 101 can also be conducted by a thermal conductor into the first enclosure 100 in some embodiments and dissipated by the airflow described herein. In some embodiments, as explained herein, the connection portion including the channel 119 can comprise a thermal insulating gap so as to mitigate or reduce the flow of heat from the first enclosure 100 to the second enclosure 101 (or vice versa). The cooling air currents A2 and A3 can be drawn or sucked into an airflow opening 129 formed in an interior portion (e.g., central portion) of the fan assembly 111. In some embodiments, for example, the cooling air A2 can pass laterally between the first heat spreader 112 or the base 115 and the fan assembly 111, and can enter the fan assembly 111 through the opening 129. As explained herein (see FIGS. 4C and 4E), the air drawn through the airflow opening 129 of the fan assembly 111 can be expelled radially outward through an outlet air opening 132 in an outflow air current A4 from the fan assembly 111. Thus, in various embodiments, air pathways of the fan assembly 111 can extend between the airflow opening 129 disposed along the longitudinal axis L and the outlet airflow opening 132 having a face disposed about an axis non-parallel to the longitudinal axis L. For example, the outlet airflow opening 132 can be disposed radially outward (e.g., generally perpendicular to the longitudinal axis L). The radially outflowing air current A4 can be directed over the heat sink 113 to drive thermal energy stored in the heat sink 113 out of the enclosure 100. As shown in FIG. 4A, expelled air A5 can be directed out of the first enclosure 100 through the exhaust port 105 to the outside environs.

Figure 4B:
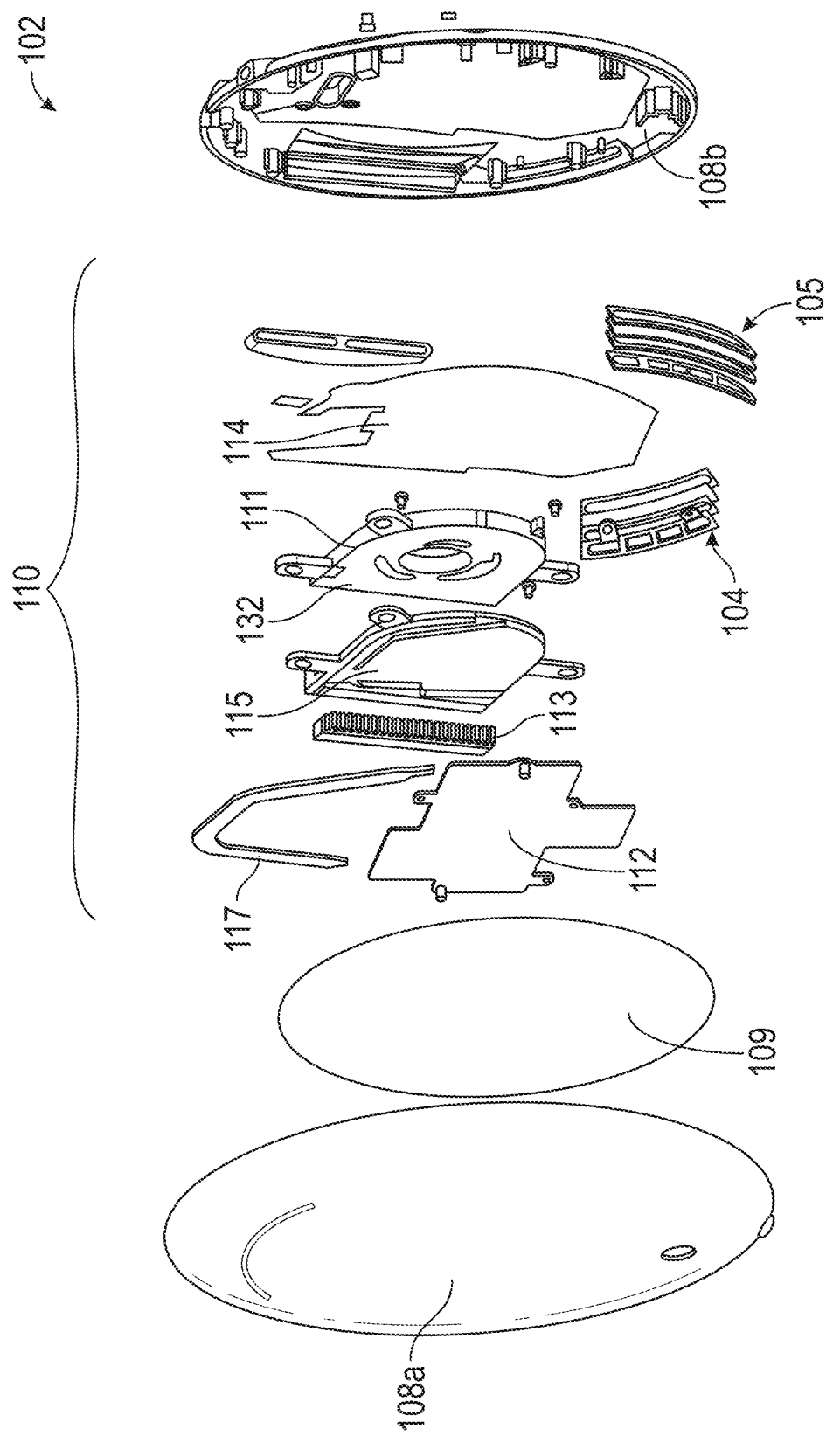
FIG. 4B is a schematic perspective, exploded view of the local processing and data module, according to another embodiment.

FIG. 4B is a schematic perspective, exploded view of the local processing and data module 70, according to another embodiment. Unless otherwise noted, the local processing and data module 70 of FIG. 4B may be similar to the local processing and data module 70 of FIG. 4A. Unlike the embodiment of FIG. 4A, in FIG. 4B, only a single inlet port 104 and a single exhaust port 105 are shown. Thus, it should be appreciated that any suitable number of inlet ports 104 and/or outlet ports 105 may be provided for intaking air into the enclosure 100 and for expelling air from the enclosure 100.

Figure 4C:
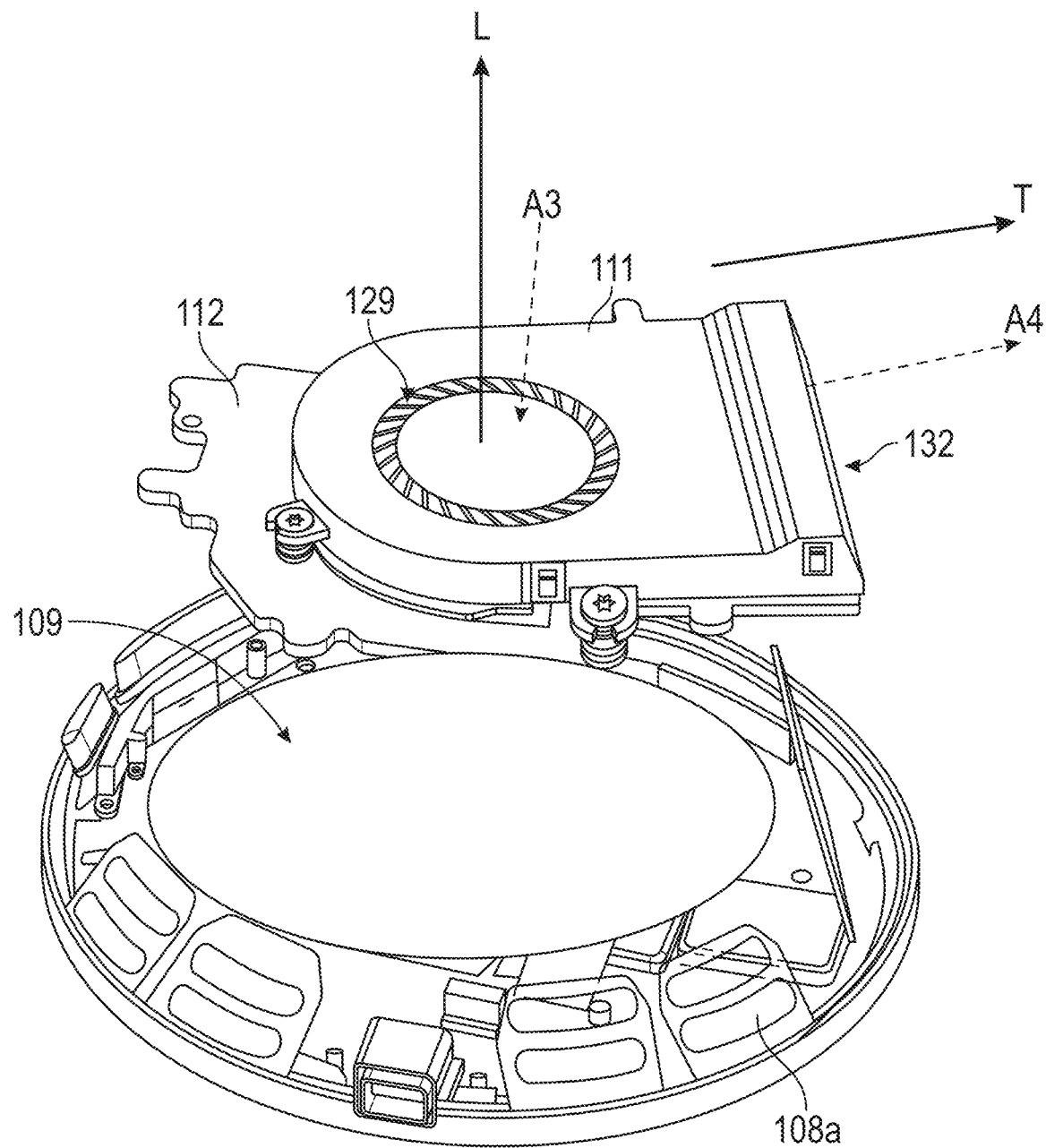
FIG. 4C is a schematic perspective, partially exploded view of a fan assembly mounted to a first heat spreader, according to various embodiments.
Figure 4D:
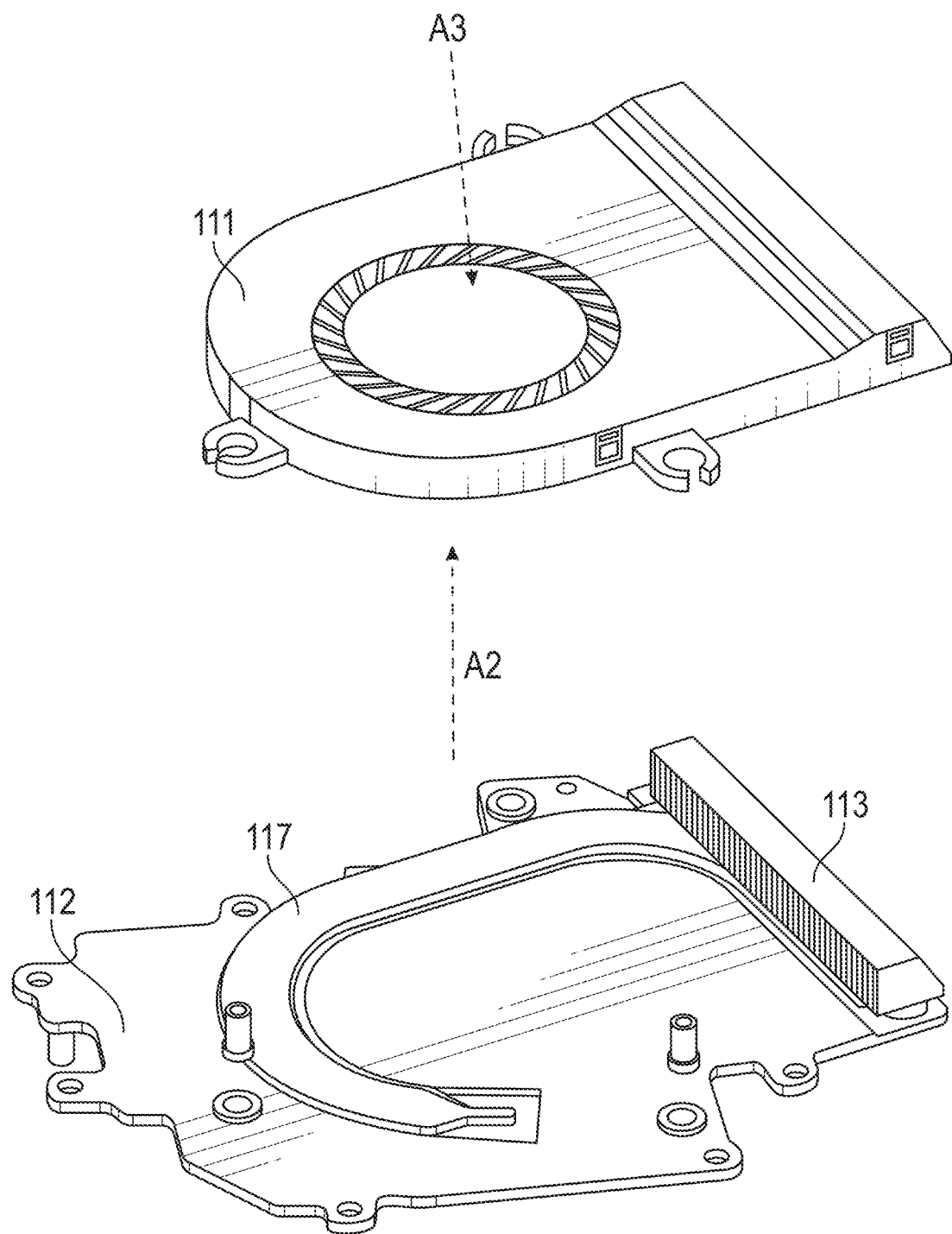
FIG. 4D is a schematic, partially exploded view of the fan assembly, the first heat spreader, a thermal conveyance pathway, and a heat sink.

FIG. 4C is a schematic perspective, partially exploded view of the fan assembly 111 mounted to the first heat spreader 112. FIG. 4D is a schematic, partially exploded view of the fan assembly 111, the heat spreader 112, the thermal conveyance pathway 117, and the heat sink 113. As shown in FIGS. 4A-4C, the electronic components 109 can be disposed near the front cover 108a. The first heat spreader 112 can be disposed rear of the electronic components, and the fan assembly 111 can be thermally coupled with, and disposed rear of, the first heat spreader 112. The first heat spreader 112 can be disposed between the electronic components 109 and the fan assembly 111. The fan assembly 111 can be thermally coupled with the first heat spreader 112. In some embodiments, a gap may be disposed between the fan assembly 111 and the heat spreader 112 or base 115 to permit air to enter the opening 129. The base 115 and thermal conveyance pathway 117 are obscured in FIG. 4C, since the base 115 and conveyance pathway 117 may be disposed between the heat spreader 112 and the fan assembly 111. As explained above in connection with FIG. 4A, the outflow air current A5 can pass over the heat sink 113 (obscured in FIG. 4C) disposed near (e.g., upstream of) the outlet opening 132 of the fan assembly 111.

As shown in FIG. 4C, the fan assembly 111 can comprise a rotational axis L and a transverse axis T disposed non-parallel relative to (e.g., perpendicular to) the axis L. The rotational axis L is a longitudinal axis of a shaft assembly or a shaft portion about which a portion of the fan assembly 111 rotates and thus is sometimes referred to as a longitudinal axis L. The cooling air currents A2 (see FIG. 4D) and A3 (see FIGS. 4C and 4D) can enter the fan assembly 111 through the airflow opening 129 from heat source(s) in the housings 100, 101, e.g., from the electronic components 109 and the power supply 118, respectively. In some arrangements, for example, the air currents A2 can pass between the heat spreader 112 or the base 115 and the fan assembly 111, and can enter the opening 129. The cooling air currents A2, A3 can have velocity components aligned along the longitudinal axis L, at least locally in the vicinity of the opening 129 and at a corresponding opening on the opposite side of the fan assembly 111. The rotation of the blades of the fan assembly 111 can therefore draw air into the fan assembly 111 with high momentum along the longitudinal axis. The outflow air current A4 can be directed radially outward through the outlet opening 132, such that the air current A4 includes velocity components aligned along the transverse axis T. The outflow air current A4 can exit the enclosure 100 by way of the exhaust port 105 (see FIGS. 4A-4B).

Figure 4E:
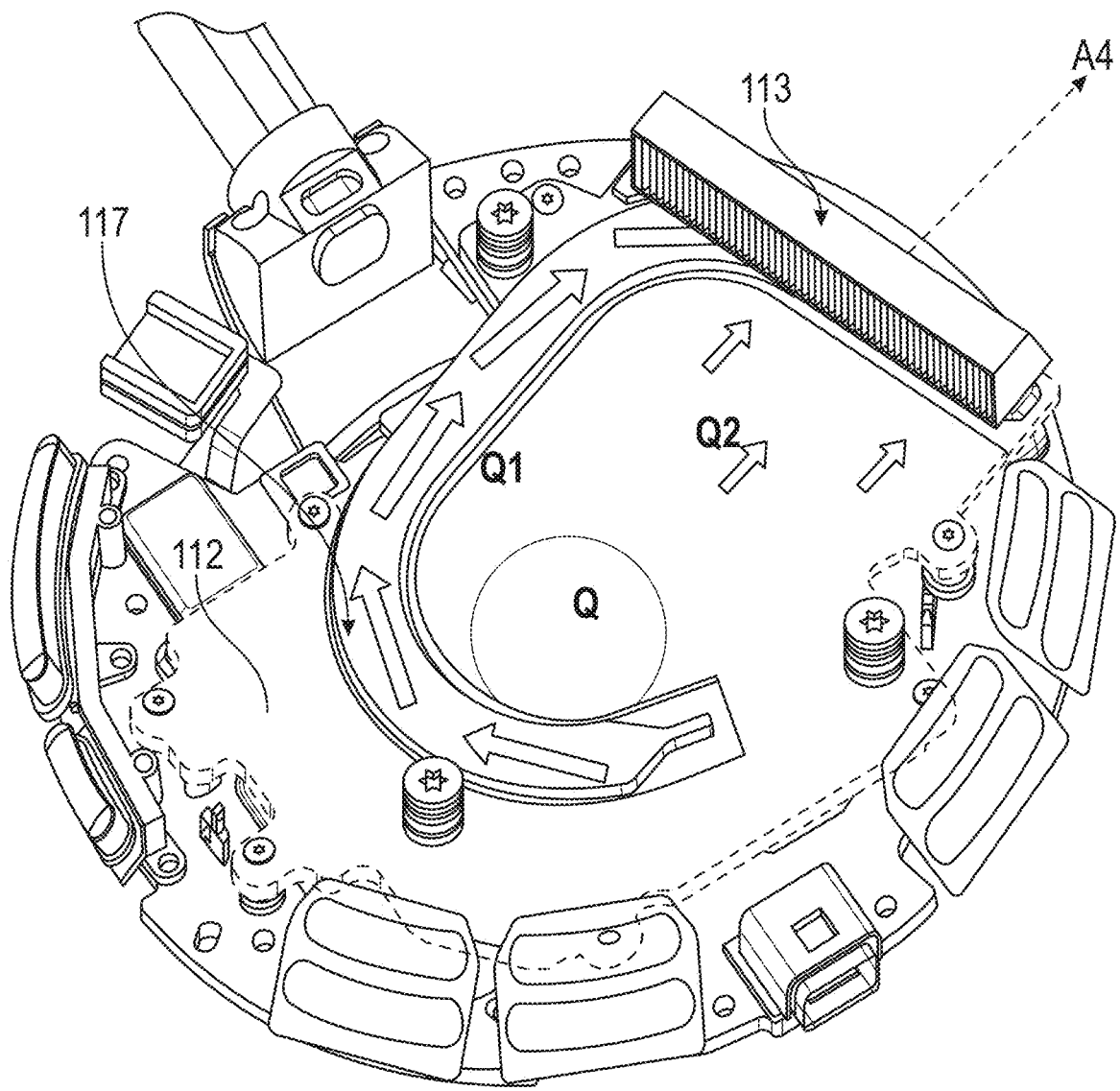
FIG. 4E illustrates a heat map of the assembled heat spreader, thermal conveyance pathway, and heat sink during operation of the fan assembly.

FIG. 4E illustrates a heat map of the assembled heat spreader, thermal conveyance pathway 117, and heat sink 113 during operation of the fan assembly 111. The heat map was computed using computational fluid dynamics (CFD) software. As shown in FIGS. 4D and 4E, the thermal conveyance pathway 117 can be coupled with the heat spreader 112, e.g., disposed in a groove or channel of the heat spreader 112. The heat spreader 112 can comprise a thermally conductive material, such as copper. The thermal conveyance pathway 117 can comprise a heat pipe comprising a thermally conductive channel. A working fluid (e.g., water) can be provided within a lumen of the thermal conveyance pathway 117. In various embodiments, the heat pipe of the conveyance pathway 117 can comprise a copper pipe that is flattened so as to have a cross-sectional profile that is generally elliptical. In various embodiments, for example, a major dimension of the heat pipe can be between two and ten times larger than a minor dimension of the heat pipe (e.g., between five and nine times larger).

As shown in FIG. 4E, thermal energy Q can be stored in and/or conducted to the heat spreader 112 from the components 109. The thermal energy Q from the heat spreader 112 can be transferred to the heat sink 113 along one or more thermal pathways Q1, Q2. For example, as shown in FIG. 4E, some thermal energy can be conveyed along a first pathway Q1 from the heat spreader 112 by way of the thermal conveyance pathway 117. By utilizing a working fluid with a high heat capacity inside a thermally conductive tubular member, thermal energy can be rapidly and effectively transferred to the heat sink 113. A second pathway Q2 can convey thermal energy along the area of the heat spreader 112 to the heat sink. As shown in FIG. 4E, the arrows representative of the first pathway Q1 are wider than the arrows representative of the second pathway Q2, indicating that heat is more efficiently and/or rapidly transferred along the first pathway Q1 than the second pathway Q2. In various embodiments, the conveyance pathway 117 can be significantly more thermally conductive than the first heat spreader 112 (e.g., at least five times, or at least ten times as thermally conductive as the heat spreader 112).

As shown in FIG. 4E, during operation of the fan assembly 111, heat can be rapidly transferred away from the heat sink by the outflow air current A4, as shown by the relatively cool temperatures maintained by the airflow over the heat sink 113. Maintaining the heat sink 113 at a cool temperature can increase the thermal gradient between the heat spreader 112 and/or the thermal conveyance pathway 117 and the heat sink 113. Beneficially, the disclosed embodiments can maintain the temperature of the local processing and data module 70 at suitably low temperatures.

Figure 5:
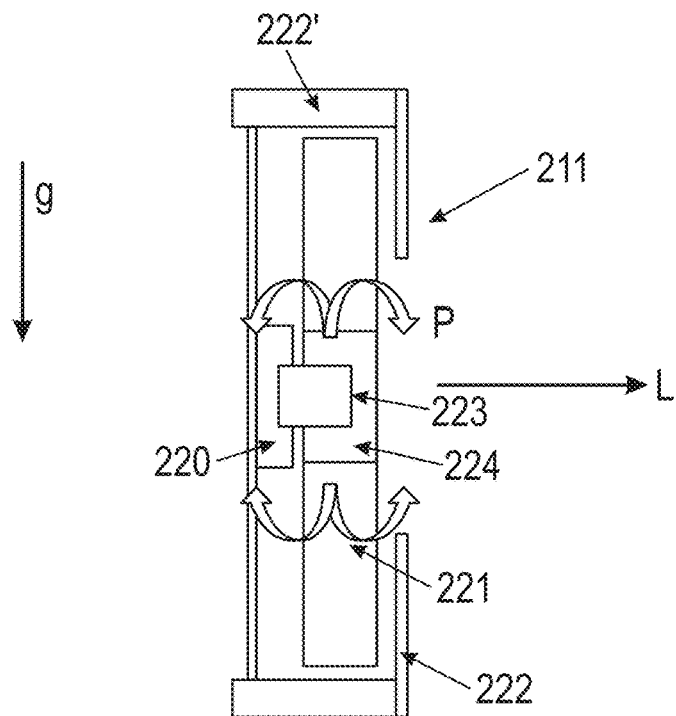
FIG. 5 is a schematic side cross-sectional view of a fan assembly that can be used in conjunction with the local processing and data module described herein.

FIG. 5 is a schematic side cross-sectional view of a fan assembly 211 that can be used in conjunction with the local processing and data module 70 described herein. The fan assembly 211 can comprise a support frame 222 configured to provide structural support to the fan assembly 211. The frame 222 can comprise multiple frame portions connected together by, e.g., fasteners or other mechanical connectors. In other embodiments, the frame 222 can comprise a unitary body. A motor 220 can be mechanically coupled with the frame 222. A shaft assembly 223 can be connected to the motor 220 and can extend along the longitudinal axis L described above, such that the longitudinal axis extends between and/or through first and second ends of the shaft assembly 223. In the embodiment of FIG. 5, in which the shaft assembly 223 is connected to the motor 220, the shaft-supporting motor 220 may be considered part of the support frame 222 or frame assembly. In the illustrated arrangement, the shaft assembly 223 is cantilevered relative to the motor 220 or the frame 222. As explained herein, the shaft assembly 223 can comprise a single shaft in some embodiments. In other embodiments, the shaft assembly 223 can comprise a plurality of shafts coupled together. A bearing 224, which can be a bushing, can be disposed at least partially around the shaft assembly 223. An impeller 221 can be operably coupled with and disposed about the bushing or other bearing 224.

In some embodiments, the motor 220 can comprise a stator (not shown) having one or more wire coils that, when energized by electric power, create changing or alternating magnetic fields sufficient to drive a magnetic rotor assembly (not shown) coupled or formed with the impeller 221 (e.g., in or on a hub or other central portion of the impeller 221). The magnetic fields generated by the motor 220 can interact with the magnetic rotor assembly of the impeller 221 to cause the magnetic rotor, and therefore the impeller 221) to rotate about the longitudinal axis L. In the illustrated embodiment, the shaft assembly 223 can be fixed to the motor 220, or to the frame 222. Thus, in the illustrated embodiment, the shaft assembly 223 may not rotate. In some embodiments, the bushing or other bearing 224 may be secured over or fixed to the shaft assembly 223, and the impeller 221 can rotate relative to the bushing 224 and the shaft assembly 223. In some embodiments the bushing or other bearing 224 may be secured or fixed to the impeller 221 and can rotate with the impeller 221 relative to the shaft assembly 223. In other embodiments, it should be appreciated that the motor 220 can include internal stator and rotor assemblies that cause the shaft assembly 223 (or portion(s) thereof to rotate). In such arrangements, the impeller 221 can be rotationally fixed relative to, and can rotate with, the shaft assembly 223.

The impeller 221 can be driven to rotate at high speeds in order to adequately remove thermal energy from the housing. For example, the impeller 221 can rotate at speeds between 5,000 rpm and 10,000 rpm, e.g., 8,000 rpm, or at higher speeds. As explained above, the local processing and data module 70 can be worn or otherwise carried by the user for VR or AR experiences. The user may often be moving while wearing the module 70 and therefore, the local processing and data module 70, and the fan assembly 211 therein, may frequently be disposed at different angles relative to gravity g. However, in some cases, the fan assembly 211 may be disposed at an angle, or may move at sufficiently high acceleration, such that the torque resulting from transverse loads on the shaft assembly 223 causes the shaft assembly 223 to bend or flex by an angle P as shown in FIG. 5. The deflection or bending of the shaft assembly 223 due to transverse loading conditions may cause the impeller 221 to contact or hit the interior surface of the frame 222, which can cause undesirable noise and/or vibration within the local processing and data module 70. Moreover, the frequent application of such external torques to the shaft assembly 223 may cause the shaft assembly 223 to wear or experience fatigues, which may damage the shaft assembly.

Accordingly, it can be desirable to reduce or eliminate noise and vibrations caused by the application of transverse loads (and the resulting torques) on the shaft assembly 223, and to reduce or eliminate the effects of fatigue or wear. The embodiments disclosed herein can advantageously control the loading transverse to the longitudinal axis L shown in FIG. 5. In some arrangements, for example, the shaft assembly 223 may be made sufficiently stiff so as to reduce the amount of deflection of the distal end of the shaft assembly 223. In other arrangements, elements on the frame 222 can assist in preventing the impeller 221 and shaft assembly 223 from contacting the frame 222 or substantially deflecting. For example, in some embodiments, a frame portion 222' of the frame disposed about the impeller 221 can comprise one or more magnets in alignment with corresponding magnet(s) in the impeller 221. For example, the magnets in the frame portion 222' and impeller can have like poles aligned so as to cause the impeller 221 to remain centered within the frame 222 or at least to oppose deflection of the impeller 221 toward the frame 222 on a transverse loading which may reduce or eliminate deflection of the shaft assembly 223.

Figure 6:
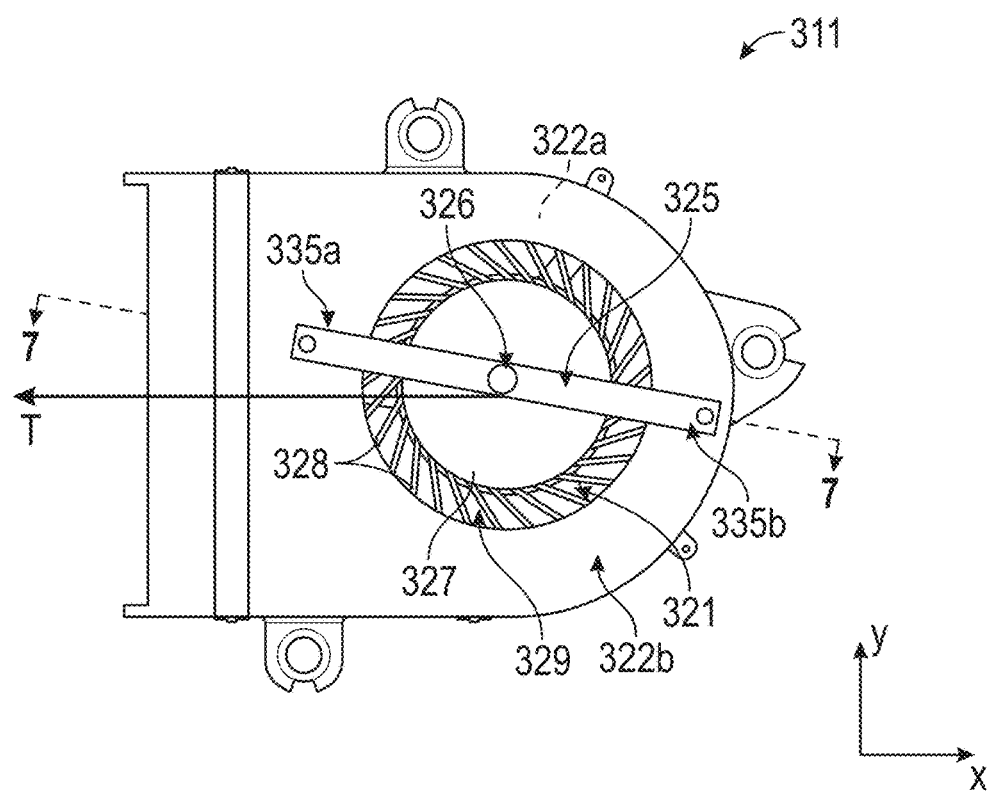
FIG. 6 is a rear plan view of a fan assembly, according to various embodiments disclosed herein.
Figure 7:
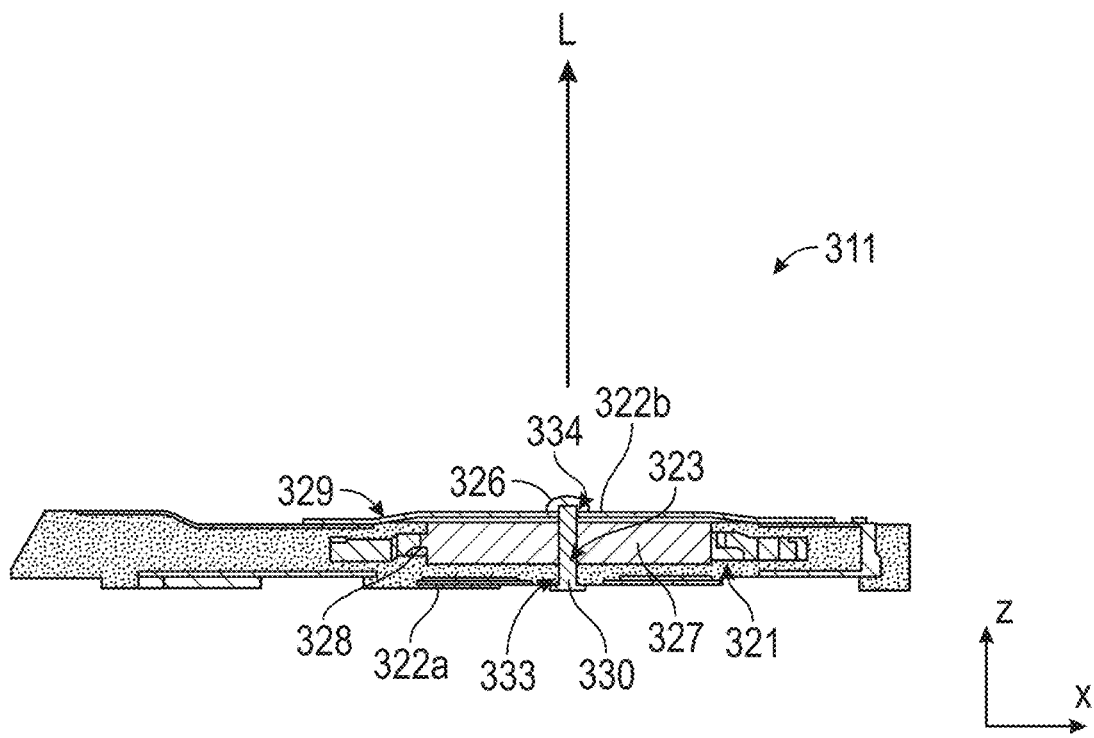
FIG. 7 is a schematic side sectional view of the fan assembly of FIG. 6.

FIG. 6 is a rear plan view of a fan assembly 311, according to various embodiments disclosed herein. FIG. 7 is a schematic side sectional view of the fan assembly 311 of FIG. 6. Unless otherwise noted, the components shown in FIGS. 6 and 7 may include components similar to like numbered components shown in FIG. 5. As shown in FIGS. 6 and 7, the fan assembly 311 can comprise a frame assembly that can have a first support frame 322a and a second support frame 322b coupled to the first frame 322a. The connected first and second support frames 322a, 322b can define an enclosure or chamber. The impeller 321 can be disposed between the first and second support frames 322a, 322b, e.g., within the enclosure defined by the frames 322a, 322b. Thus, in the illustrated embodiment, the first and second support frames 322a, 322b can define a housing in which the impeller 321 is disposed. The impeller 321 of FIGS. 6 and 7 can comprise a hub 327 and one or a plurality of blades 328 (e.g., fan blades) coupled with and/or extending from the hub 327. The hub 327 can be coupled with the shaft assembly 323. In some embodiments, a bushing can be disposed between the shaft assembly 323 and the hub 327. As explained above, in some embodiments the impeller 321 can rotate relative to the rotationally fixed shaft assembly 323. In other embodiments, the impeller 321 can rotate with the rotating shaft assembly 323.

As shown in FIG. 7, a first end 333 of the shaft assembly 323 can be supported by or coupled with the first support frame 322a (e.g., to a support structure defined by or including the frame, to the motor, etc.) For example, in the embodiment of FIG. 7, the first end 333 of the shaft assembly 123 can be secured to the first frame 322a at a first shaft support 330 of the first support frame 322a. In various embodiments, the first end 333 can be welded, glued, or press fit onto the frame 322a. The first shaft support 330 can comprise a portion of a structural body defined by the first support frame 322a. In other embodiments, the first support frame 322a can comprise the motor such that the first end 333 of the shaft assembly 323 is secured to the motor and the shaft support 330 comprises a portion of the motor. It should be appreciated that any suitable structure can be used as the shaft support 330 so as to secure the first end 333 of the shaft assembly 323.

As explained above, it can be advantageous to control transverse loads applied to the shaft assembly 323 so as to reduce noise and vibrations, and to mitigate the risks of fatigue, wear, or excessive loading conditions. Accordingly, in the embodiment of FIGS. 6 and 7, a second support frame 322b can be provided to control transverse loading on the shaft assembly 323. The second support frame 322b can be coupled with the first support frame 322a and can be disposed at or over a second end 334 of the shaft assembly 323 so as to control transverse loading at the second end 334 of the shaft assembly 323. In FIGS. 6 and 7, the second support frame 322b can comprise a second shaft support 326 coupled with the second end 334 of the shaft assembly 323. The second shaft support 326 can be rigidly attached to the second support frame 322b across at least a portion of the airflow opening 329. In some embodiments, the second shaft support 326 can comprise a pin or other connector that rigidly attaches the second end 334 of the shaft assembly 323 to the frame 322b. In various embodiments, the second shaft support 326 (e.g., a pin) can be connected concentrically or axially relative to the axis L about which the shaft assembly 323, the impeller 321 or both the shaft assembly 323 and the impeller rotate. Positioning the second shaft support 326 along or centered relative to the axis L can beneficially reduce deflections and improve the rotation of the impeller 321.

In the embodiment of FIGS. 6 and 7, the second shaft support 326 can comprise or be connected with an elongate member 325 between first and second end portions 335a, 335b thereof. As shown in FIG. 6, the first end portion 335a of the elongate member 325 can be supported at a first portion of the second support frame 322b, and the second end portion 335b of the elongate member 325 can be supported at a second portion of the second support frame 322b. The first and second end portions 335a, 335b (and the corresponding first and second portions of the second frame 322b) can be spaced apart about a periphery of the airflow opening 329. In the illustrated embodiment, for example, the first and second end portions 335a, 335b (and the first and second portions of the frame 322b) can be disposed on generally opposite sides of the airflow opening 329. In other embodiments, however, the first and second end portions 335a, 335b of the elongate member 325 can be spaced apart peripherally by less than 180°. For example, the elongate member 325 may extend from the first end portion 335a over the airflow opening 329 and may connect with the second end 334 of the shaft assembly. The elongate member 325 may further extend from the second end 334 to the second end portion 335b at an angle less than 180°.

Rigidly supporting the second end 334 of the shaft assembly 323, in addition to supporting the first end 333, can beneficially control transverse loading on the shaft assembly 323 and can reduce or eliminate deflections of the assembly 323. However, since the elongate member 325 may be disposed across part of or the entire airflow opening 329, the elongate member 325 may interfere with the influent air entering the fan assembly 311 through the airflow opening 329. Accordingly, in the illustrated embodiment, the elongate member 325 can be angled relative to the transverse axis T by an angle A selected or determined so as to reduce or minimize disruption to the influent air (e.g., such that the airflow into the opening 329 is maximized or increased sufficiently for thermal design goals). For example, in some embodiments, computational techniques (such as computational fluid dynamics, or CFD) can calculate the estimate air flow field through the motor assembly 311. The analysis or calculations can determine the desired angle A at which to orient the elongate member 325. In various embodiments, the desired angle A can correspond to a global or local maximum of airflow when the impeller 321 is rotating, as compared over a range of angles A of the elongate member 325 (with the elongate member 325 being attached to the frame 322b). In some embodiments, computational techniques can be applied without the elongate member 325 to determine the locations of the opening 329 at which the airflow is less compared to other positions about the opening 329 during operation of the fan assembly 311. If a minimum or reduced airflow region is found (without the elongate member 325 being attached), then the desired location or orientation of the elongate member 325 may correspond with these regions of lesser airflow. In the illustrated embodiment, it can be desirable to orient the elongate member 325 at a sufficiently small angle A relative to the transverse axis T, so that air can flow around the relatively thin profile of the elongate member 325 at such angles. In various embodiments, the angle A can be in a range of −45° to 45°, e.g., in a range of −30° to 30°. It should be appreciated, however, that other angles A may be used depending on the specific flow dynamics of the fan assembly 311. Beneficially, in various embodiments, the manufacturer or assembler can accordingly assemble the fan assembly 311 and, based upon the determined lesser airflow regions during operation of the fan assembly 311 without the elongate member 325, the manufacturer can position the elongate member 325 so as to minimize disruptions to airflow (e.g., by orienting the elongate member 325 over these minimal flow regions). Orienting the elongate member 325 during assembly and after calculation of minimal airflow patterns can enable the manufacturer or assembler to account for specific airflow patterns of the device being cooled before affixing the elongate member 325.

As discussed further below, the orientation of the elongate member 325 can be generally transverse to the direction of locally greater or globally greatest airflow over the frame 322a and through the opening 329 (or through an opening in the frame 322b). The elongate member 325 can be oriented to have a minimal profile facing this greater or greatest airflow regime.

Figures 6A, 6B, 6C:
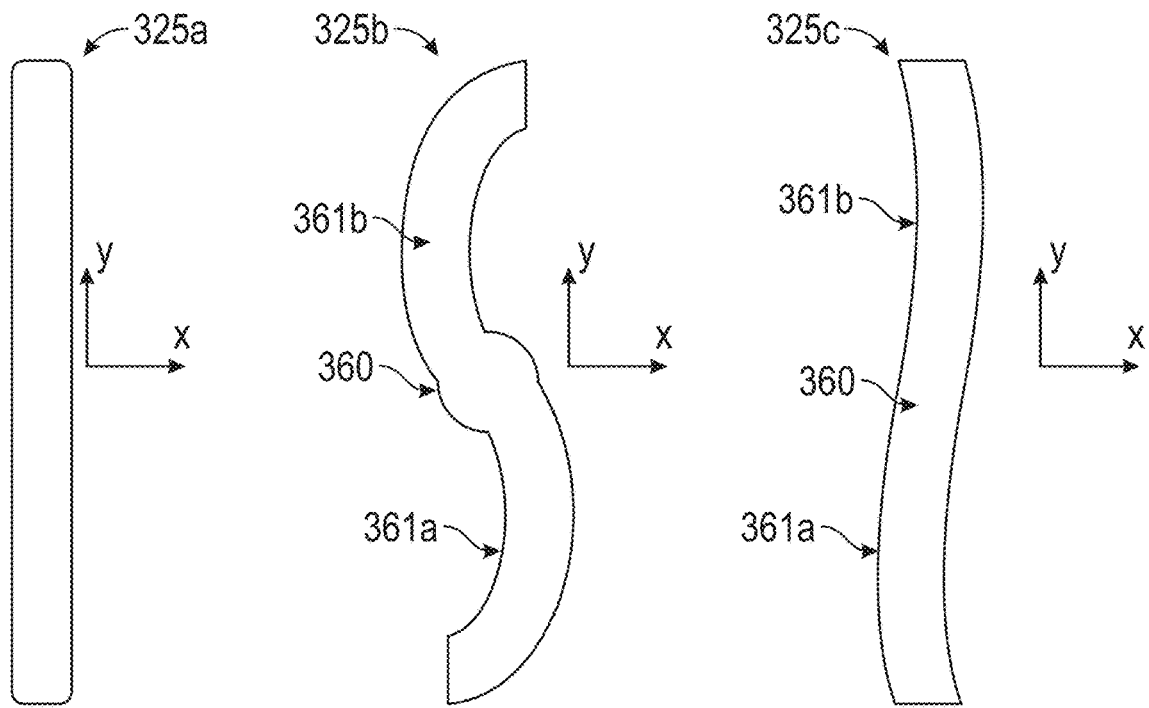
FIG. 6A is a schematic top plan view of an elongate member having a generally straight profile along a plane defined generally parallel with the rotational plane of the impeller.
FIG. 6B is a schematic top plan view of an elongate member having a first curved region and a second curved region, according to one embodiment.
FIG. 6C is a schematic top plan view of an elongate member having a first curved region and a second curved region, according to another embodiment.

FIGS. 6A-6F illustrate various top and side profiles of the elongate member 325 described herein. For example, FIG. 6A is a schematic top plan view of an elongate member 325a having a generally straight profile along an x-y plane defined generally parallel with the rotational plane of the impeller 321, e.g., the impeller 321 may rotate within a plane 321, e.g., parallel to the x-y plane shown in FIG. 6 such that the x-y plane may be transverse to the rotational longitudinal axis L. FIG. 6B is a schematic top plan view of an elongate member 325b having a first curved region 361a and a second curved region 361b. In FIG. 6B, the first and second curved regions 361a, 361b may reverse the direction of curvature at or near a transition region 360. For example, the transition region 360 can serve as an inflection region at which the first and second regions 361a, 361b change directions of curvature. Similarly, FIG. 6C is a schematic top plan view of an elongate member 325c having a first curved region 361a and a second curved region 361b, according to another embodiment. Unlike in FIG. 6B, in FIG. 6C, the first and second curved regions 361a, 361b can change the directions of curvature along a smooth or continuous inflection or transition region 360. The shapes as shown from a top down view (e.g., along the x-y plane) may be selected so as to achieve a desired flow profile through the fan assembly.

Figure 6D:
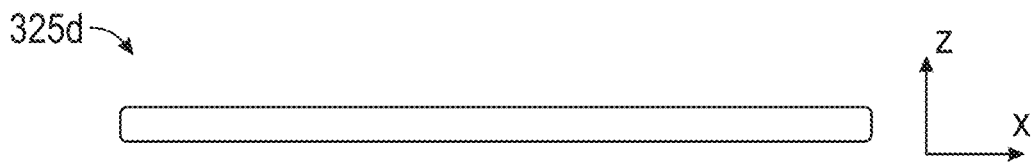
FIG. 6D is a schematic side view of an elongate member having a generally planar or straight profile, as viewed along a plane defined generally transverse to the plane shown in FIGS. 6A-6C.
Figure 6E:
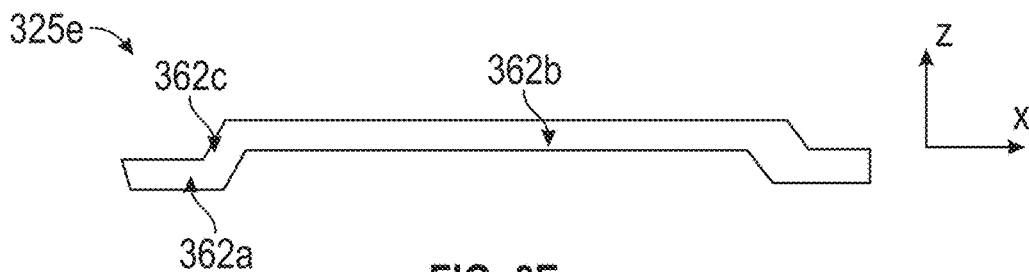
FIG. 6E is a schematic side view of an elongate member having a non-linear or shaped profile, as viewed along a plane defined generally transverse to the plane shown in FIGS. 6A-6C, according to some embodiments.

FIG. 6D is a schematic side view of an elongate member 325d having a generally planar or straight profile, as viewed along an x-z plane defined generally transverse to the x-y plane, e.g., parallel to the direction of the longitudinal rotational axis L (see the x-z plane shown in FIG. 7). FIG. 6E is a schematic side view of an elongate member 325e having a non-linear or shaped profile, as viewed along an x-z plane. For example, as shown in FIG. 6E, the elongate member 325e can comprise a first portion 362a disposed along a first location of the z-axis and a second portion 362b disposed offset from the first portion 362a along the z-axis (which may be parallel or generally aligned with the longitudinal axis L). A third transition portion 362c may serve to connect the first and second portions 362a, 362b.

Figure 6F:
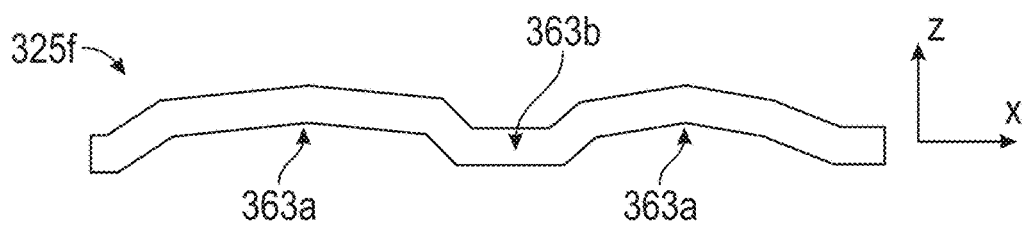
FIG. 6F is a schematic side view of an elongate member having a non-linear or curved profile, as viewed along a plane defined generally transverse to the plane shown in FIGS. 6A-6C, according to another embodiment.

FIG. 6F is a schematic side view of an elongate member 325f having a non-linear or curved profile, as viewed along an x-z plane, according to another embodiment. As with the embodiment of FIG. 6E, the elongate member 325f can comprise first portions 363a along a first location along the z-axis, and one or more second portions 363b at other locations along the z-axis. Unlike the embodiment of FIG. 6E, the member 325f of FIG. 6F can comprise curved surfaces along the z-axis. Thus, as shown in FIGS. 6A-6F, the shape of the elongate member 325 may vary within the x-y plane and/or within the x-z plane. The elongate members 325a-325f may accordingly be shaped to have any suitable type of three-dimensional profile for improving the flow through the fan assembly.

Figure 8:
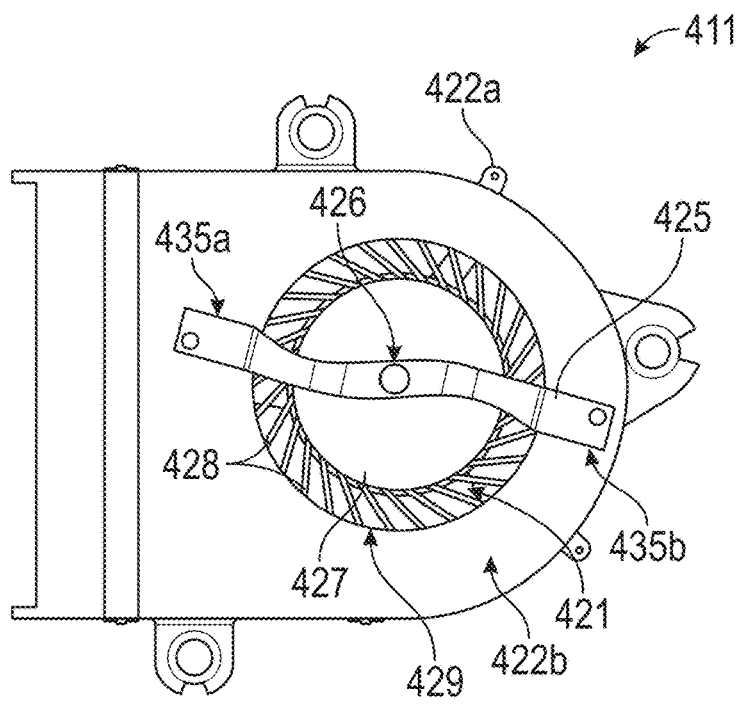
FIG. 8 is a rear plan view of a fan assembly, according to another embodiment.

FIG. 8 is a rear plan view of a fan assembly 411, according to another embodiment. Unless otherwise noted, the components shown in FIG. 8 may include components similar to like numbered components shown in FIGS. 6-7, with the reference numerals incremented by 100 relative to FIGS. 6-7. Unlike the embodiment of FIGS. 6 and 7, however, the elongate member 425 shown in FIG. 8 can have an airfoil shape so as to further improve airflow through the fan assembly 411. In some embodiments, a thickness of the elongate member 425 can vary along a length of the elongate member 425 between the first and second end portions 435a, 435b. In some embodiments, a width of the elongate member 425 can vary along the length of the elongate member 425 between the first and second end portions 435a, 435b. In various embodiments, the width and/or thickness of the elongate member 425 can be selected to be sufficiently strong so as to support the shaft assembly 423 during the expected transverse loading conditions and to accommodate the induced stresses. Thus, the embodiment of FIG. 8 can also beneficially control transverse loading on the shaft assembly 423 while maintaining adequate airflow through the fan assembly 411.

Figure 9:
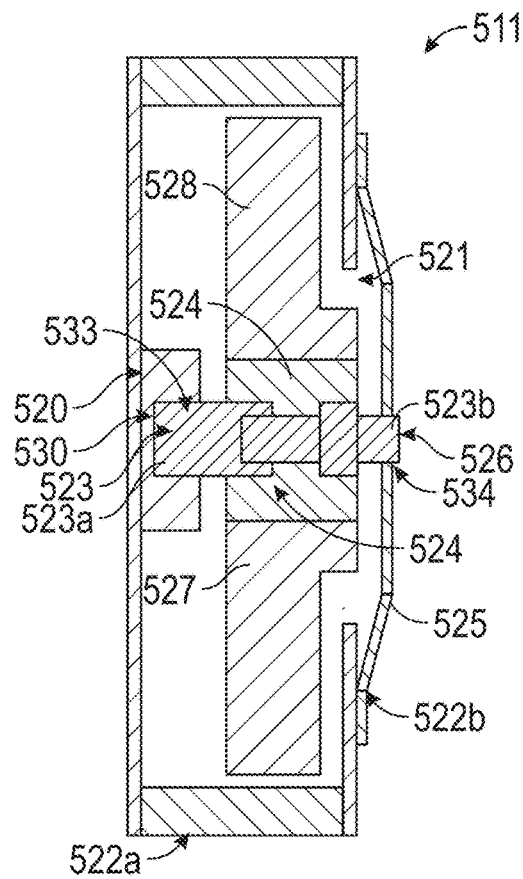
FIG. 9 is a schematic side sectional view of a fan assembly 111, according to another embodiment.

FIG. 9 is a schematic side sectional view of a fan assembly 511, according to another embodiment. Unless otherwise noted, the components shown in FIG. 9 may include components similar to like numbered components shown in FIGS. 6-8, with the reference numerals incremented by 100 relative to FIG. 8. For example, as with the embodiment of FIGS. 6-8, the fan assembly 511 can include the impeller 521 coupled with the shaft assembly 523 (e.g., by way of the bushing 524). Moreover, as with FIGS. 6-8, the first end 533 of the shaft assembly 523 can be fixed or secured to the first frame 522a, for example, at the first shaft support 530 which may be disposed at or on the motor 520 or on a structural body defined by the frame 522a. In addition, as with FIGS. 6-8, the second end 533 of the shaft assembly 523 can be fixed or secured to the second frame 522b at the second shaft support 526, which may also comprise the elongate member 525. Beneficially, the first and second shaft supports 526 can control transverse loading on the shaft assembly 523 and can reduce deflections of the shaft assembly 523. Moreover, as explained above, in some embodiments, the angular orientation of the elongate member 525 can be selected so as to improve airflow through the fan assembly 511 or in some cases to minimize the airflow cost of including the elongate member 525 in the air flow stream.

However, unlike the embodiments of FIGS. 6-8, in FIG. 9, the shaft assembly 523 can comprise a first shaft portion 523a rotationally fixed (e.g., secured) to the first support frame 522a and a second shaft portion 523b rotationally fixed (e.g., secured) to the impeller 521. As shown in FIG. 9, the first end 533 of the shaft assembly 523 can be disposed on a first side of the impeller 521, and the second end 534 of the shaft assembly 523 can be disposed on a second side of the impeller 521 that is opposite the first side. The second shaft portion 523b can be rotatable over and/or relative to a free end of the first shaft portion 523a. In some embodiments, the first and second shaft portions 523a, 523b can comprise two separate shafts that are connected together, e.g., at the impeller 521. In some embodiments, the first and second shaft portions 523a, 523b can comprise a single shaft, with the first portion 523a on the first side of the impeller 521 and the second portion 523b on the second side of the impeller 521.

Thus, in the embodiment of FIG. 9, the first shaft portion 523a can be rotationally fixed relative to the first frame 522a (e.g., the motor 520 or a structural body of the frame 522a. The second shaft portion 523a can rotate with the impeller 521 and bushing 524. As with the above embodiments, supporting the second end 534 of the shaft assembly 523 with the second frame 522b can beneficially control transvers loading conditions and reduce deflections of the shaft assembly 523.

Figure 10:
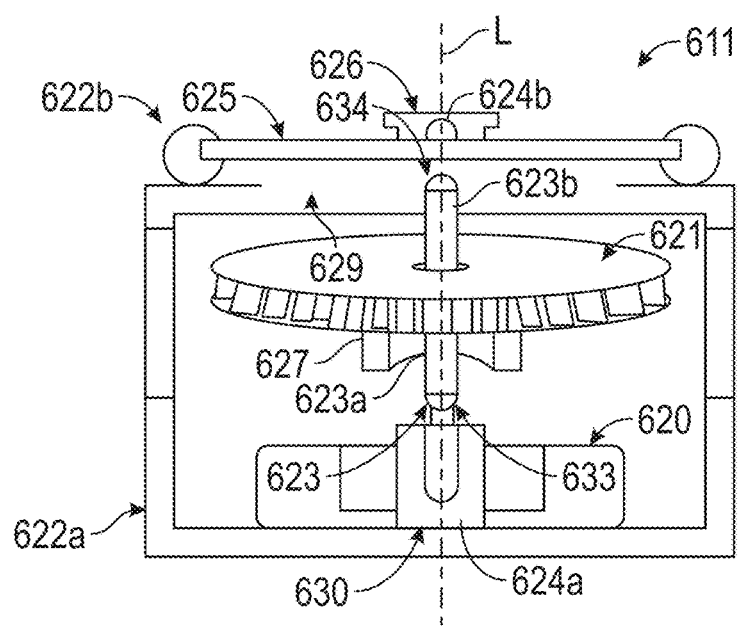
FIG. 10 is a schematic side sectional view of a fan assembly, according to another embodiment.

FIG. 10 is a schematic side sectional view of a fan assembly 611, according to another embodiment. Unless otherwise noted, the components shown in Figure may include components similar to like numbered components shown in FIGS. 6-9, with the reference numerals incremented by 100 relative to FIG. 9. For example, as with FIG. 9, the first end 633 of the shaft assembly 623 can operably couple with the first frame 622a (which may comprise a structural body of the frame, the motor 620, or any other suitable stationary feature of the fan assembly 611. The second end 634 of the shaft assembly 623 can operably couple with the second frame 622b. In FIG. 10, the impeller 621 and shaft assembly 623 are illustrated in a partially exploded view for ease of illustration. During operation, however, it should be appreciated that the first end 633 of the shaft assembly 623 engages with the first frame 622a, and the second end 634 of the shaft assembly 623 engages with the second frame 622b.

Moreover, as with FIG. 9, the impeller 621 can be coupled with first and second shaft portions 623a, 623b of the shaft assembly 623. The first and second shaft portions 623a, 623b can comprise a single unitary shaft, or the first and second shaft portions 623a, 623b can comprise two separate shafts. In the embodiment of FIG. 10, the shaft portions 623a, 623b can be fixed to the impeller 621 so as to impart rotation to the impeller 621. For example, a portion of the impeller hub 627 can include a follower magnet or rotor assembly. A stator assembly of the motor 620 can be energized so as to create magnetic forces on the hub 627 to impart rotation of the impeller 621. In addition, as shown in FIG. 10, a concave member comprising a first bushing 624a can be coupled or formed with the first frame 622a and/or the motor 620. A second concave member comprising a second bushing 624b can be coupled or formed with the second frame 622b. The first bushing 624a can act as the first shaft support 630 to rotationally support the first end 633 of the shaft assembly 623, and the second bushing 624b can act as or comprise the second shaft support 626 to rotationally support the second end 634 of the shaft assembly 623. Thus, during rotation of the impeller 621, the first end 633 of the first shaft portion 623a can rotate within the first bushing 624a. The second end 634 of the second shaft portion 623a can rotate within the second bushing 624b.

Beneficially, the second bushing 624b can assist in controlling the transverse loading on the shaft assembly 624 during operation of the fan assembly 611. As shown, the second bushing 624b of the shaft support 626 can be aligned along or aligned concentrically relative to the second shaft portion 623b. In some embodiments, the second shaft support 626 can also comprise the elongate member 625 extending across part of or the entire airflow opening 629. As shown in FIG. 10, one or both of the first and second bushings 624a, 624b can comprise a concave member, e.g., a concave inner surface. In some embodiments, the concave inner surface may comprise or define a generally or substantially spherical surface. The concave inner surface defined in the first and/or second bushings 624a, 624b can beneficially permit rotation of the shaft assembly 623 while supporting both ends 633, 634 of the shaft assembly 623 against transverse loading conditions. Moreover, the concave inner surfaces of the first and/or second bushings 624a, 624b can be shaped so as to accommodate small but acceptable rotation and/or translation of the ends 633, 634 of the shaft assembly 623. Accommodating such negligible movement of the ends 633, 634 can further reduce stresses on the shaft assembly 623 while preventing undesirable large deformations.

Figure 10A:
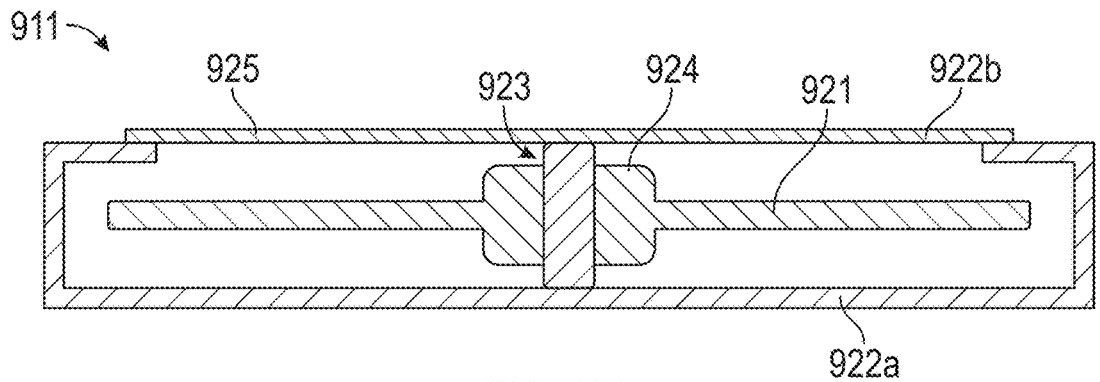
FIG. 10A is a schematic side view of a fan assembly comprising a shaft assembly that operably couples to an impeller assembly by way of a bushing, according to some embodiments.

FIGS. 10A-10D illustrate additional examples of a fan assembly that can be used in conjunction with the embodiments disclosed herein. For example, FIG. 10A is a schematic side view of a fan assembly 911 comprising a shaft assembly 923 that operably couples to an impeller assembly 921 by way of a bushing 924. Unless otherwise noted, the components shown in FIG. 10A may include components similar to like numbered components shown in FIGS. 6-10, with the reference numerals incremented by 100 relative to FIG. 10. In the embodiment of FIG. 10A, the shaft assembly 923 can comprise a single shaft that can be connected at its ends to frames 922a, 922b (e.g., welded to the elongate member 925 or frame 922b, mechanically fastened, or otherwise fixed). In some embodiments, one of the frames 922b can comprise the elongate member 925. In Figure the shaft assembly 923 can comprise a separate member from the bushing 924 and impeller 921, e.g., the shaft assembly 923 of FIG. 10A may not be integrally formed with the bushing 924. In FIG. 10A, the shaft assembly 923 may or may not be rotationally fixed to the bushing 924. For example, in some embodiments, the shaft assembly 923 may not be rotationally fixed to the bushing 924 such that the bushing 924 and impeller 921 may rotate relative to (e.g., may rotate about) the fixed shaft assembly 923. In other embodiments, the bushing 924 and impeller 921 may be rotationally fixed or coupled to the shaft assembly 923 such that the impeller 921 and bushing 924 rotate with or follow the rotation of the shaft assembly 923.

Figure 10B:
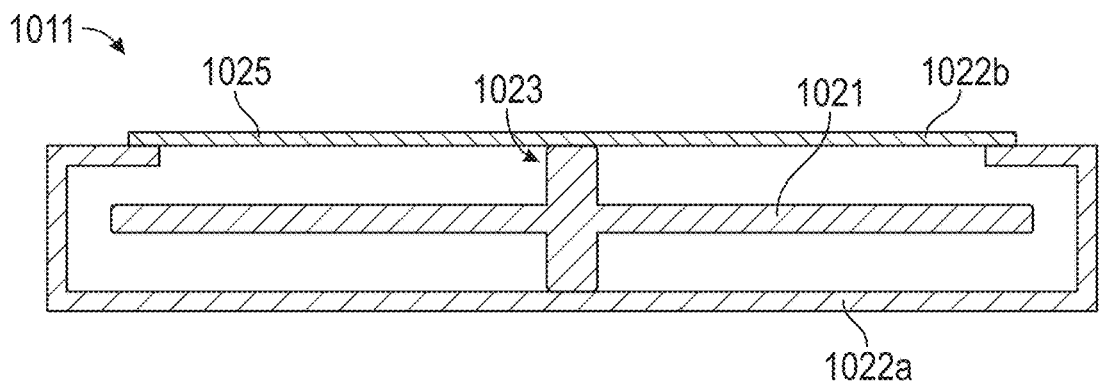
FIG. 10B is a schematic side view of a fan assembly comprising a shaft assembly that operably couples to an impeller assembly by way of a bushing, according to another embodiment.

FIG. 10B is a schematic side view of a fan assembly 1011 comprising a shaft assembly 1023 that operably couples to an impeller assembly 1021 by way of a bushing 1024. Unless otherwise noted, the components shown in FIG. 10B may include components similar to like numbered components shown in FIGS. 6-10A, with the reference numerals incremented by 100 relative to FIG. 10A. Unlike the embodiment of FIG. 10A, in the embodiment of FIG. 10B, the shaft assembly 1023 may be physically integrated with the impeller 1021 (and/or with a bushing, not shown) so as to define a single unitary shaft assembly and impeller. Thus, in FIG. 10B, the shaft assembly 1023 can be fixed at its ends to the frames 1022a, 1022b (one of which may comprise an elongate member 1025). Rotation of the shaft assembly 1023 can impart rotation to the integrally formed impeller 1021.

Figure 10C:
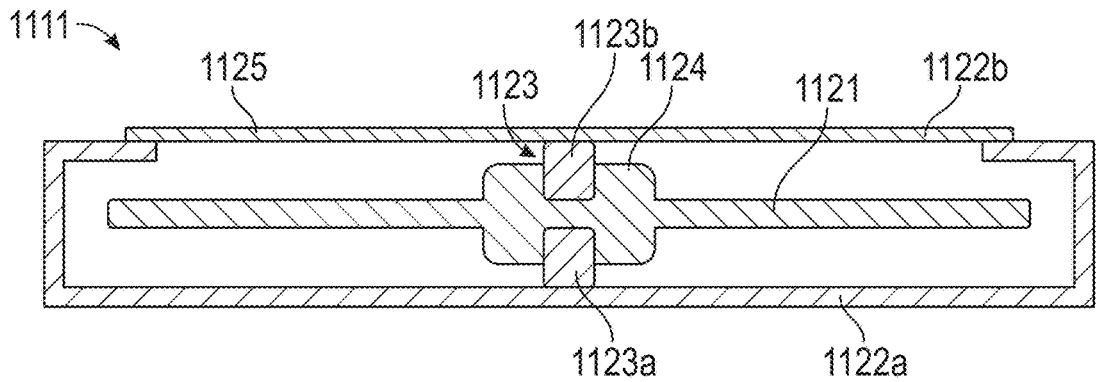
FIG. 10C is a schematic side view of a fan assembly comprising a shaft assembly having first and second shaft portions operably coupled with the impeller, according to another embodiment.

FIG. 10C is a schematic side view of a fan assembly 1111 comprising a shaft assembly 1123 having first and second shaft portions 1123a, 1123b operably coupled with the impeller 1121. Unless otherwise noted, the components shown in FIG. 10C may include components similar to like numbered components shown in FIGS. 6-10B, with the reference numerals incremented by 100 relative to FIG. 10B. In the embodiment of FIG. 10C, the first and second shaft portions 1123a, 1123b can comprise separate shafts that are respectively coupled with the frames 1122a, 1122b. The first and second shaft portions 1123a, 1123b can connect to the impeller 1121 by way of the hub 1124. In FIG. 10C, the first and second shaft portions 1123a, 1123b can be fixed to the frames 1122a, 1122b such that the impeller 1121 and hub 1124 rotate relative to the shaft portions 1123a, 1123b. In other embodiments, the first and second shaft portions 1123a, 1123b can be fixed to the hub 1124 such that the hub 1124 and impeller 1121 can rotate with the first and second shaft portions 1123a, 1123b.

Figure 10D:
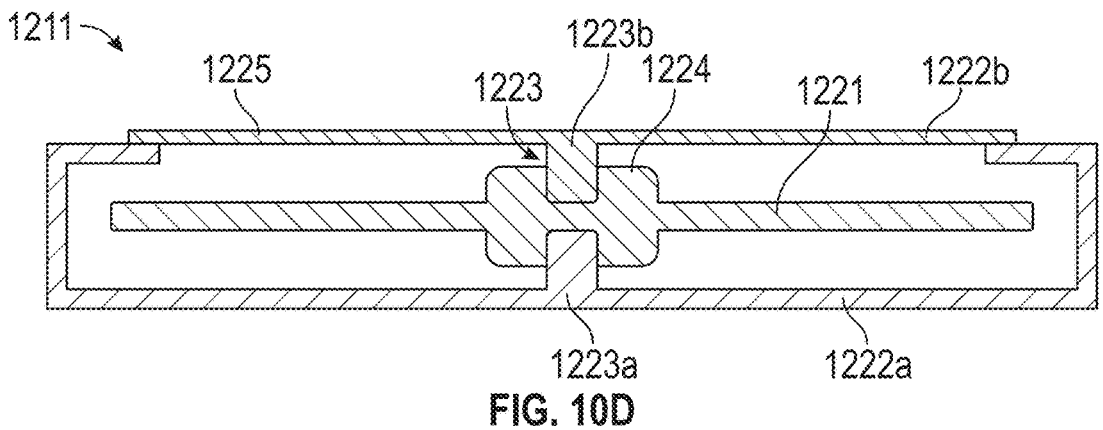
FIG. 10D is a schematic side view of a fan assembly comprising a shaft assembly having first and second shaft portions operably coupled with the impeller, according to another embodiment.

FIG. 10D is a schematic side view of a fan assembly 1211 comprising a shaft assembly 1223 having first and second shaft portions 1223a, 1223b operably coupled with the impeller 1221. Unless otherwise noted, the components shown in FIG. 10D may include components similar to like numbered components shown in FIGS. 6-10C, with the reference numerals incremented by 100 relative to FIG. 10C. Unlike the embodiment of FIG. 10C, for example, the first shaft portion 1223a can be integrally formed with the first frame 1222a, e.g., the first shaft portion 1223a and the first frame 1222a can define a single unitary component such that the first shaft portion 1223a extends from the first frame 1222a. Similarly, the second shaft portion 1223b can be integrally formed with the second frame 1222b, e.g., the second shaft portion 1223b and the second frame 1222b can define a single unitary component such that the second shaft portion 1223b extends from the second frame 1222b. In some embodiments, the first and second shaft portions 1223a, 1223b can be fixed such that the hub 1224 and impeller 1221 rotate relative to the shaft portions 1223a, 1223b.

Figure 11:
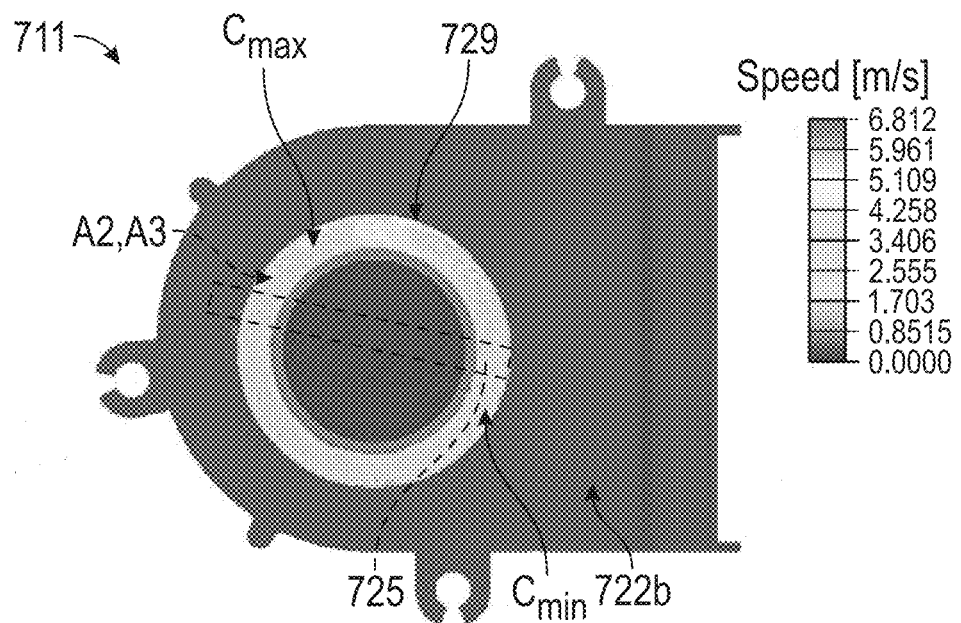
FIG. 11 is a plan view of flow patterns within a fan assembly before an elongate member is attached to the fan assembly.
Figure 12:
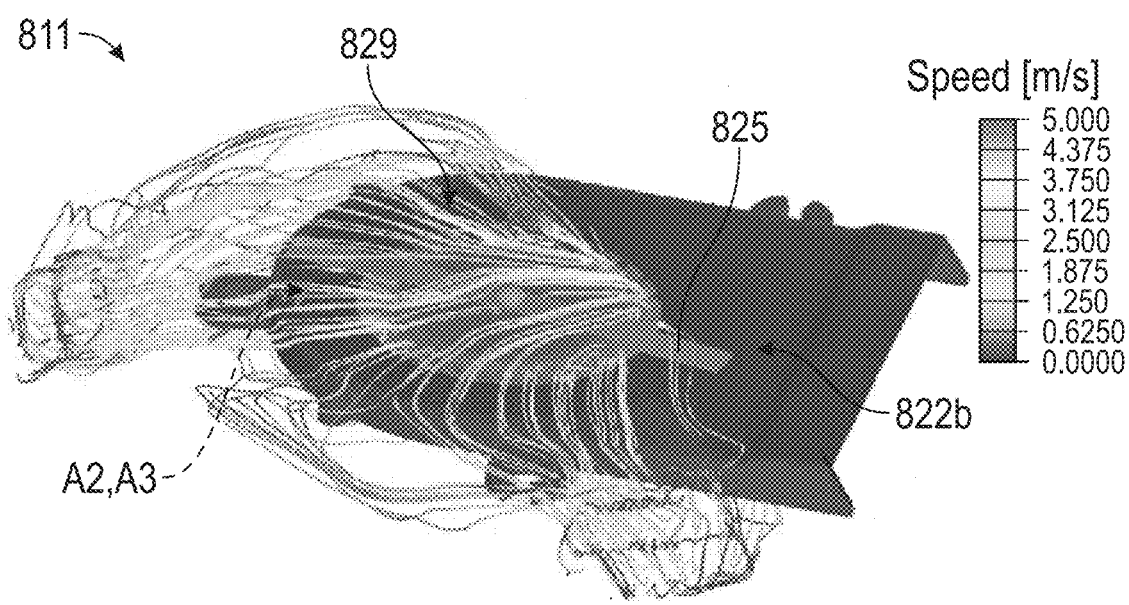
FIG. 12 is a schematic perspective view of flow patterns within and around a fan assembly after the elongate member is placed at a desired orientation relative to the fan assembly.

FIG. 11 is a plan view of flow patterns within a fan assembly 711 before an elongate member 725 is attached to the fan assembly 711. FIG. 12 is a schematic perspective view of flow patterns within and around a fan assembly 811 after the elongate member 825 is placed at a desired orientation relative to the fan assembly 811. The flow patterns of FIGS. 11 and 12 were computed using computational fluid dynamics (CFD) techniques.

FIG. 11 represents the velocity field of cooling air currents A2, A3 (see FIG. 4A) that flow into the airflow opening 729 of the fan assembly 711, without or before the elongate member 725 is attached. As explained above, the fan assembly 711 may be used in conjunction with various types of portable electronic devices, which may include different types or numbers of electronic components. Once the electronic device design has been completed, the flow patterns through the fan assembly 711 can be computed to determine the velocity field of the fan assembly 711 during operation and accounting for the electronic components within the housing. For the assembly 711 shown in FIG. 11 when used in conjunction with a local processing and data module 70, the circumferential location Cmax representative of maximum or increased airflow can be determined. Similarly, the circumferential location Cmin representative of minimum or reduced airflow can be determined.

Based on the velocity profile determined for the fan assembly 711 without the elongate member 725, the desired orientation of the elongate member 725 can be selected. In some cases, it may be desirable to orient the elongate member 725 to correspond to minimum airflow through the opening 729. In some embodiments, one end portion of the elongate member 725 can be positioned at the circumferential location Cmin and the other end portion can be disposed at an opposite circumferential location. In some embodiments, the first and second end portions of the elongate member 725 can be positioned circumferentially based on a weighted average or other determinative criteria for minimum airflow. By positioning the elongate member 725 at regions of minimum or reduced airflow, the effect of the elongate member 725 on the airflow into the fan assembly 711 can be reduced or eliminated.

FIG. 12 illustrates the airflow pathways A2, A3 and their velocity profiles through the fan assembly 811 after the elongate member 825 is oriented according to the selections and determinations made in connection with FIG. 11. As shown in FIG. 12, the elongate member 825 does not appreciably reduce the airflow through the fan assembly 811. Rather, the airflow pathways A2, A3 pass over the elongate member 825 with little or no loss of momentum.

Figure 13B:
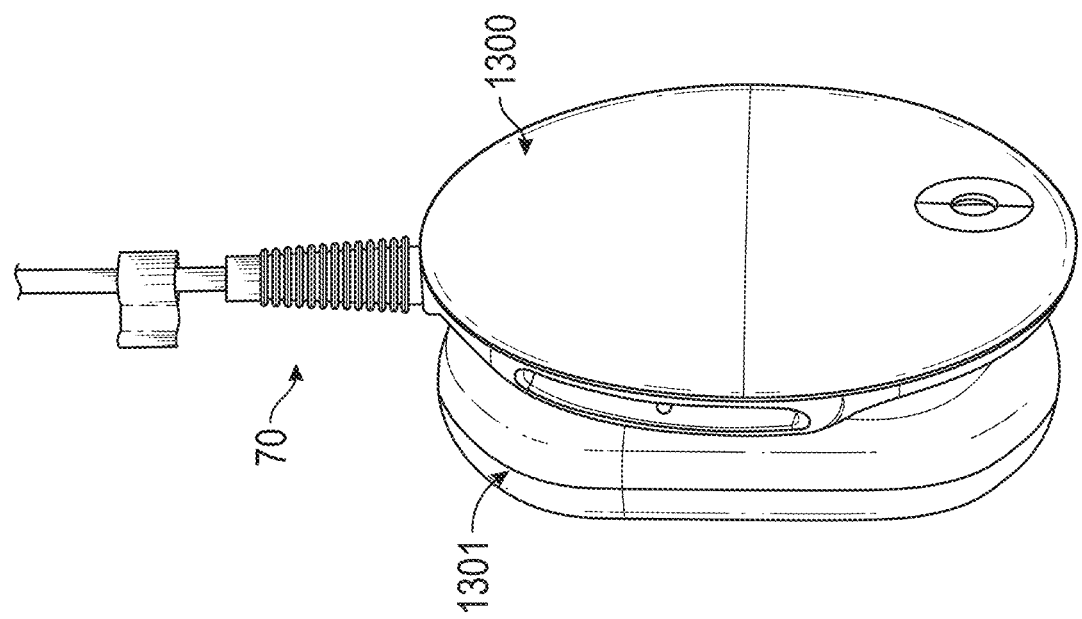
FIG. 13B is a schematic front, right perspective view of the electronic device of FIG. 13A.
Figure 13A:
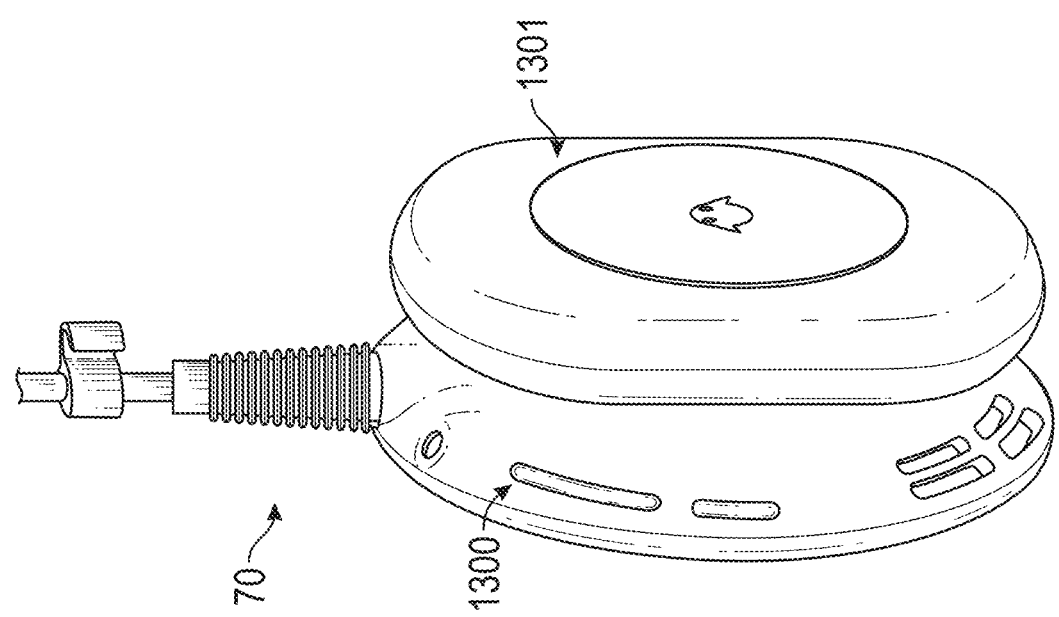
FIG. 13A is a schematic back, left perspective view of an electronic device according to one embodiment.
Figure 13D:
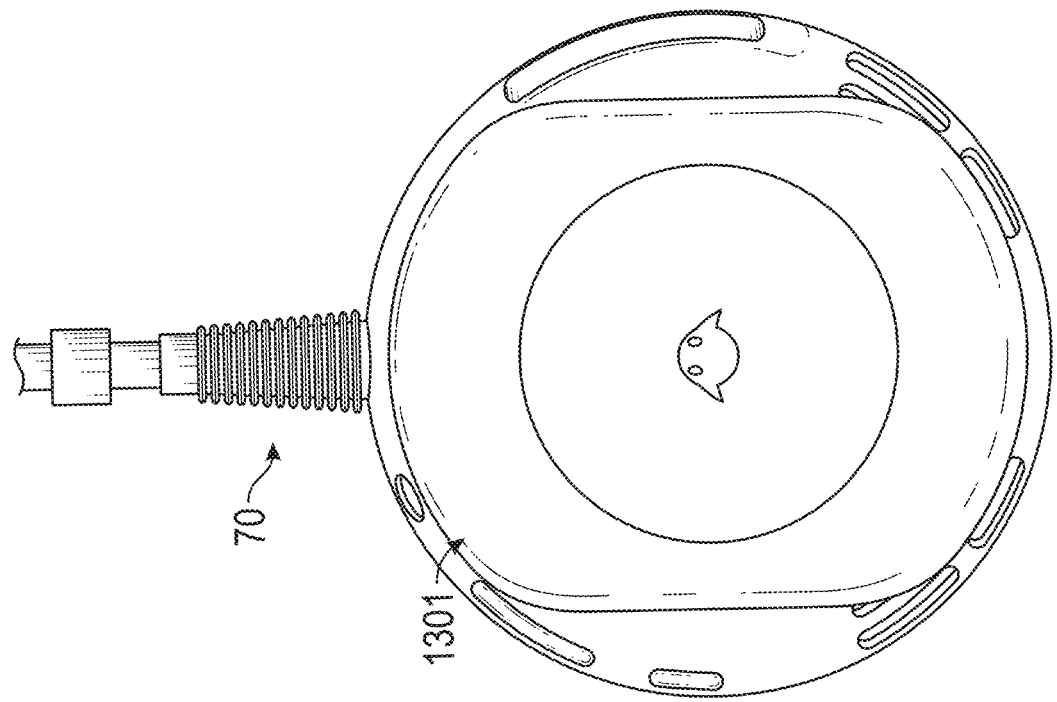
FIG. 13D is a schematic back plan view of the electronic device of FIGS. 13A-13C.
Figure 13C:
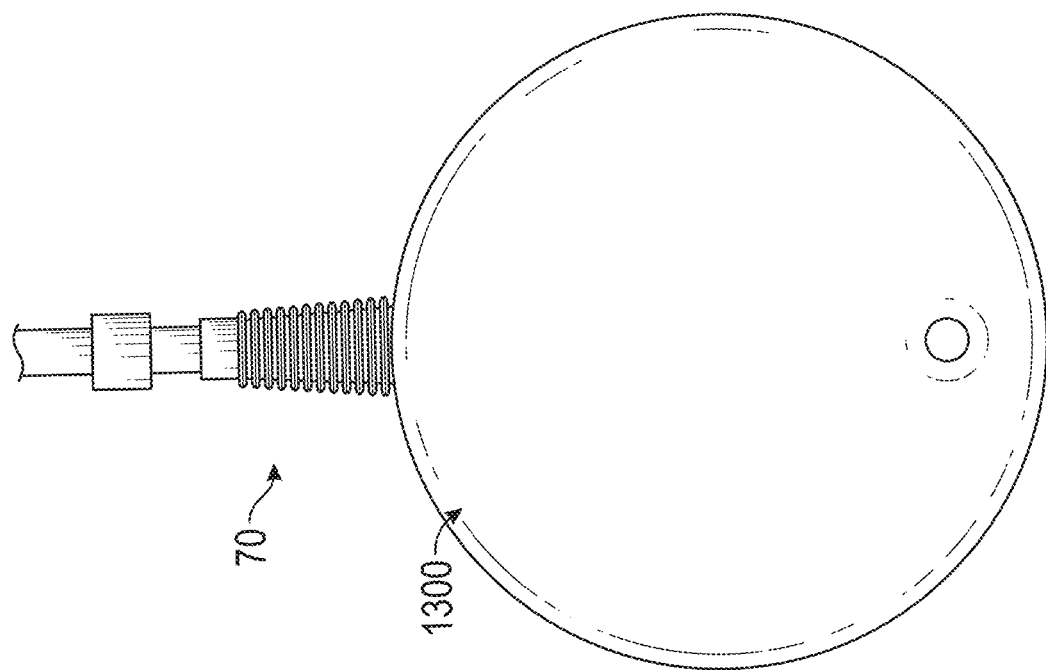
FIG. 13C is a schematic front plan view of the electronic device of FIGS. 13A-13B.
Figure 13F:
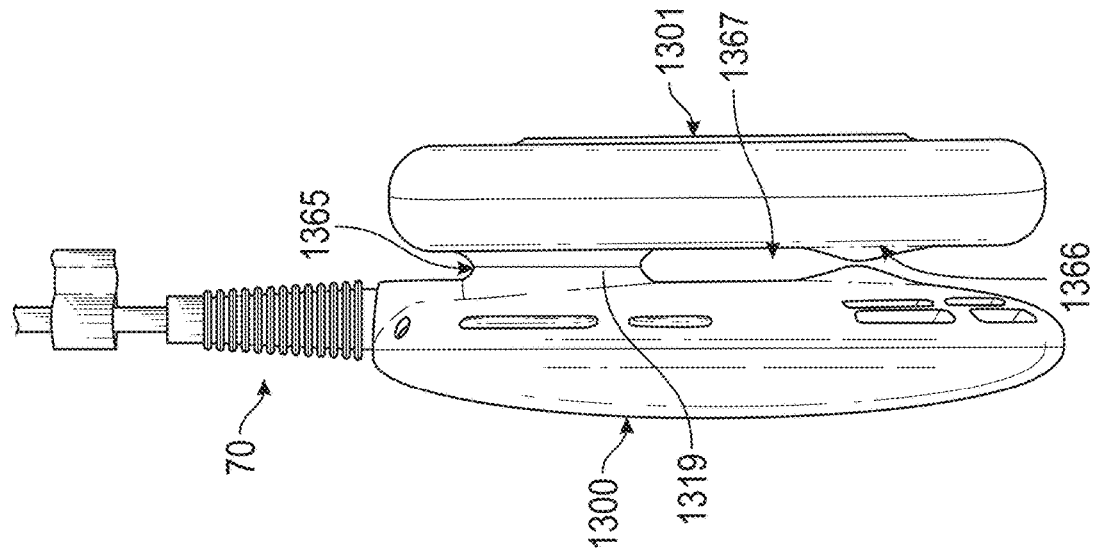
FIG. 13F is a schematic left side view of the electronic device of FIGS. 13A-13E.
Figure 13E:
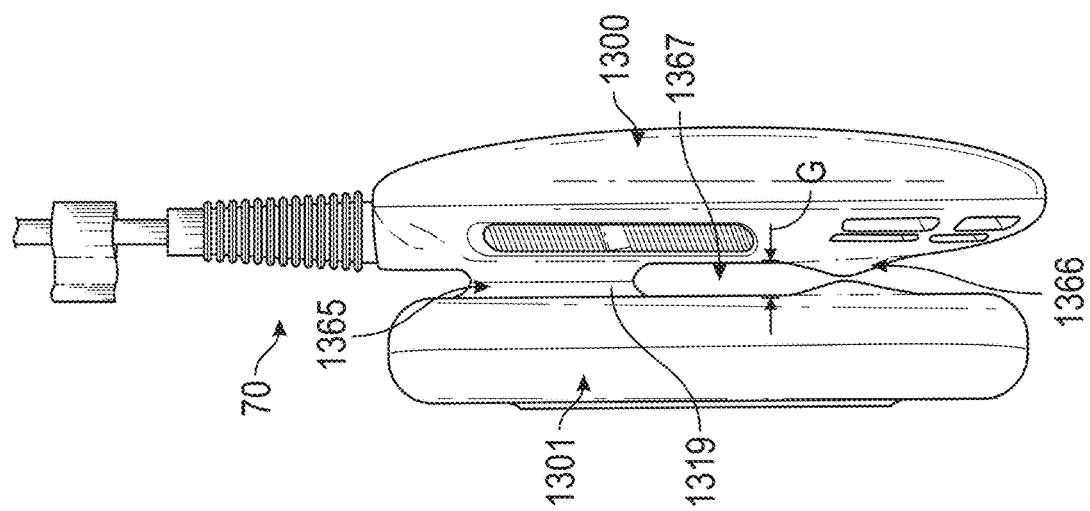
FIG. 13E is a schematic right side view of the electronic device of FIGS. 13A-13D.
Figure 13H:
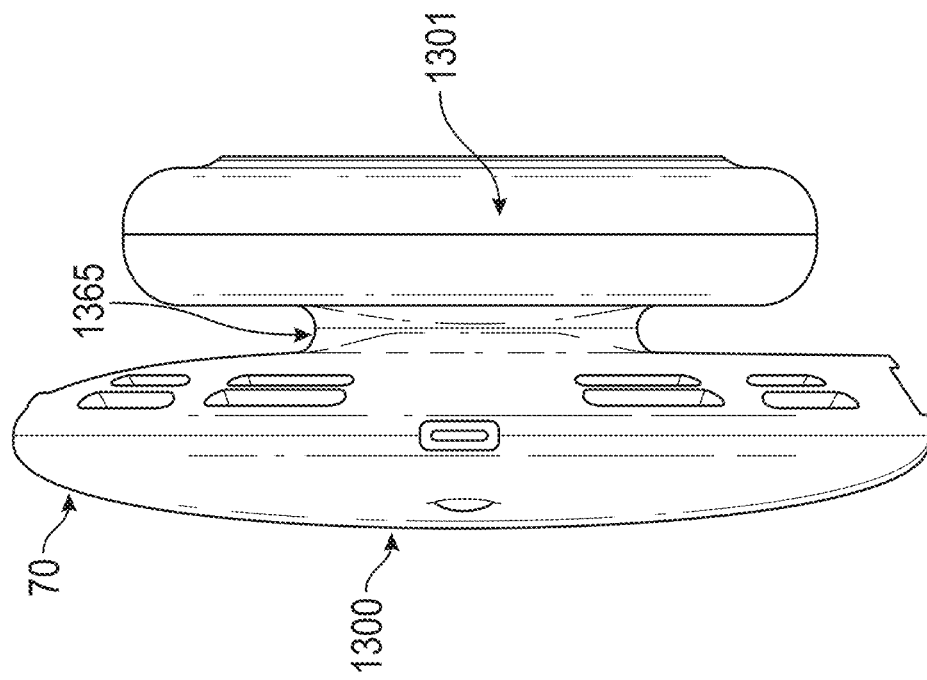
FIG. 13H is a schematic bottom plan view of the electronic device of FIGS. 13A-13G.
Figure 13G:
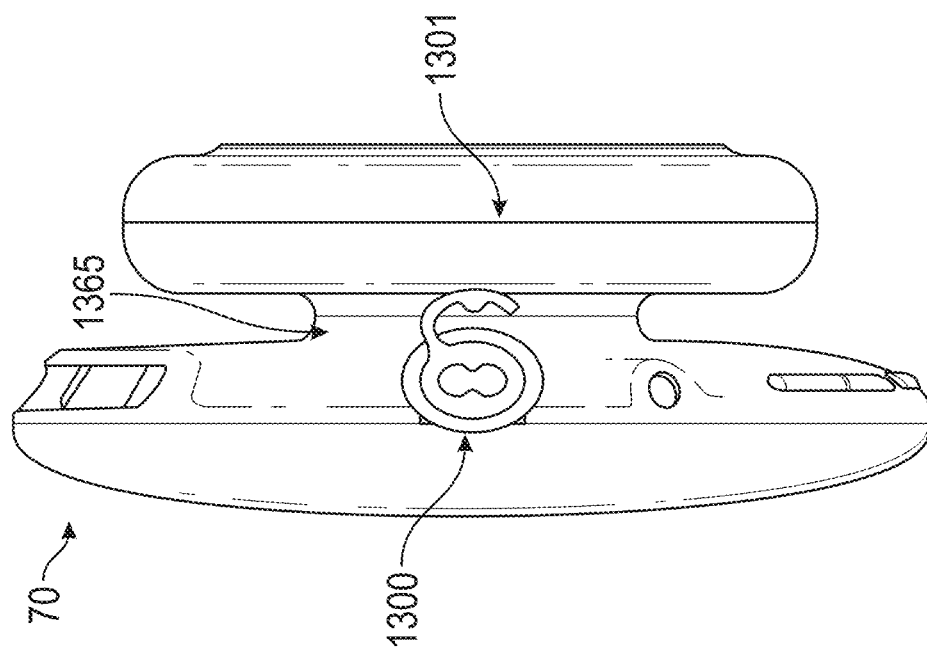
FIG. 13G is a schematic top plan view of the electronic device of FIGS. 13A-13F.

FIG. 13A is a schematic back, left perspective view of an electronic device according to one embodiment. FIG. 13B is a schematic front, right perspective view of the electronic device of FIG. 13A. FIG. 13C is a schematic front plan view of the electronic device of FIGS. 13A-13B. FIG. 13D is a schematic back plan view of the electronic device of FIGS. 13A-13C. FIG. 13E is a schematic right side view of the electronic device of FIGS. 13A-13D. FIG. 13F is a schematic left side view of the electronic device of FIGS. 13A-13E. FIG. 13G is a schematic top plan view of the electronic device of FIGS. 13A-13F. FIG. 13H is a schematic bottom plan view of the electronic device of FIGS. 13A-13G.

The electronic device can comprise the local processing and data module 70 described above. As explained above in connection with FIGS. 3A-3D, the local processing and data module 70 can comprise a first enclosure 1300 (which may be similar to the enclosure 100) and a second enclosure 1301 spaced from the first enclosure 1300 by a gap 1367. As explained herein, one or more electronic devices (e.g., processor(s)) may be provided in a first compartment defined at least in part by the first enclosure 1301. One or more other electronic devices (e.g., one or more batteries, one or more processor(s), etc.) may be provided in a second compartment defined at least in part by the second enclosure 1302.

In various embodiments, it can be desirable to operate the electronic device at high speeds (e.g., at high speeds for central processing and/or graphics processing units), while also charging the power supply (e.g., battery(ies) of the electronic device). The battery(ies) disclosed herein can be any suitable type of battery, including, e.g., a lithium ion battery(ies). However it can be challenging to operate the processor(s) at high speeds (and corresponding high temperatures) while also charging and/or discharging the battery(ies). For example, in some embodiments, the processor(s) can operate up to about 95° C. before throttling back (e.g., before dynamic frequency scaling or throttling is started). Such high temperatures for processor operation may exceed the maximum temperature thresholds for effective battery usage (e.g., which may be at or near 45° C. in some embodiments). Thus, the temperature rise from operating the processor(s) at high speeds may reduce the ability to rapidly and effectively charge the battery(ies) during use of the electronic device (e.g., during high speed operation of the processor(s)). It should be appreciated that the processor and battery operating temperatures are schematic, and that the processor(s) and battery(ies) can be operated at various temperatures.

Accordingly, various embodiments disclosed herein utilize the first and second enclosures 1300, 1301 in conjunction with a connection portion 1365 to thermally separate the compartments of the enclosures 1300, 1301. For example, the processor(s) may be disposed in the first compartment of the first enclosure 1300, and may operate at high speeds and, therefore, high temperatures. The battery(ies) can be disposed in the second compartment of the second enclosure 1301 and can electrically communicate with other components of the device, e.g., with the processor(s) in the first enclosure 1300. In some embodiments, one or more processing elements can be disposed in the first enclosure 1300, and one or more other processing elements can be disposed in the second enclosure 1301. In some embodiments the processing elements in both enclosures 1300, 1301 can be used to control the operation of the system.

In some embodiments, the connection portion 1365 can comprise the channel 1319, which may be similar to the channel 119 described above. In some embodiments, the connection portion 1365 can comprise an air or thermal gap that separates the first and second enclosures 1300, 1301. The relatively low thermal conductivity of the air gap (and high thermal insulation properties) can serve to thermally separate the processor(s) in the first enclosure 1300 from the battery(ies) in the second enclosure 1301. In some embodiments, one or more connectors or wires can pass through the channel 119 to electrically connect the processor(s) in the first enclosure 1300 with the battery(ies) of the second enclosure 1301. Additional components may also be provided in the first and/or second enclosures 1300, 1301. Beneficially, therefore, the thermal gap provided by the connection portion 1365 can reduce or substantially prevent heat from passing from the processor(s) in the first enclosure 1300 to the battery(ies) in the second enclosure 1301. Thus, the processor(s) can operate at relatively high speeds and temperatures, while maintaining the battery(ies) at sufficiently low temperatures so as to enable charging during operation of the processor(s). By contrast, providing the battery(ies) and processor(s) within a single compartment or enclosure may not provide adequate heat separation between the battery(ies) and processor(s).

In the illustrated embodiment, the connection portion 1365 comprises an air gap to provide thermal insulation between the first and second enclosures 1300, 1301. In other embodiments, other low thermal conductivity materials (such as insulators or dielectrics) may be provided in the connection portion 1365. For example, in some embodiments, a thermally insulating polymer (e.g., potting compound or encapsulant) may be provided in the connection portion 1365. In some embodiments, the first and second compartments defined by the first and second enclosures 1300, 1301 may also be filled with a gas (e.g., air). In other embodiments, the electronic devices (e.g., processor(s), battery(ies), etc.) may also be encapsulated or otherwise enclosed within another type of insulating material, such as a polymer or dielectric.

Further, as shown in FIGS. 13E-F, the first and second enclosures 1300, 1301 can be separated by a gap 1367 (e.g., at a location spaced from or below the connection portion 1365) having a gap width G as shown in FIG. 13E, which may be similar or generally the same as the width or gap defined by the connection portion 1365 disposed or extending between the first and second enclosures 1300, 1301. The gap 1367 (e.g., an air gap between the enclosures 1300, 1301) can provide improved thermal separation between the first and second enclosures 1300, 1301. In some embodiments, a majority of the spaces between the compartments within first and second enclosures 1300, 1301 may be filled with air or a gas. For example, the channel 1319 can be filled with a gas in some embodiments, and the gap 1367 between outer portions of the enclosures 1300, 1301 can comprise a gas such as air. As shown, the channel 1319 can have a side cross-sectional area that is smaller than a cross-sectional area of the first compartment of the first enclosure 1300 (and/or smaller than the cross-sectional area of the second compartment of the second enclosure 1301), taken along a direction parallel to a maximum dimension of the first compartment.

The enclosures 1300, 1301 can comprise a clip 1366 disposed within the gap 1367. The clip 1366 can comprise projection(s) extending from the first and second enclosures 1300, 1301. The clip 1366 can improve wearability of the module 70, e.g., on a belt or other clothing accessory of the user). In some embodiments, the gap width G of the connection portion 1365 (e.g., the channel 1319) and/or the gap 1367 may be in a range of 0.5 mm to 10 mm, in a range of 1 mm to 7 mm, or in a range of 1 mm to 5 mm. Providing a thermal gap or thermal barrier (e.g., air gap) may provide sufficient thermal separation between the enclosures 1300, 1301. In some embodiments, one or both of the enclosures 1300, 1301 may be constructed of a material that has a relatively low thermal conductivity so as to further improve the thermal barrier between the internal compartments of the enclosures 1300, 1301. For example, in some embodiments, a lower thermal conductivity material (e.g., aluminum or plastic) may be used as compared with higher thermal conductivity materials. In various embodiments, as disclosed above, the thermal gap provided by the connection portion 1365 and/or the gap 1367 may still permit at least some heat flow from the first enclosure 1300 to the second enclosure 1301. The fan assemblies disclosed herein can mitigate this heat transfer, however, so as to reduce heat dissipation from the first enclosure 1300 to the second enclosure 1301.

Figure 14A:
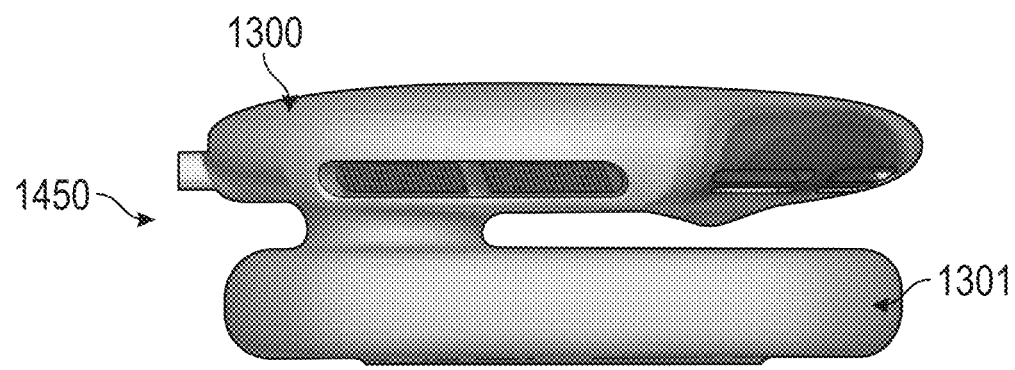
FIG. 14A is a schematic heat transfer map of a side view of the electronic device of FIGS. 13A-13H during operation of the electronic devices.
Figure 14B:
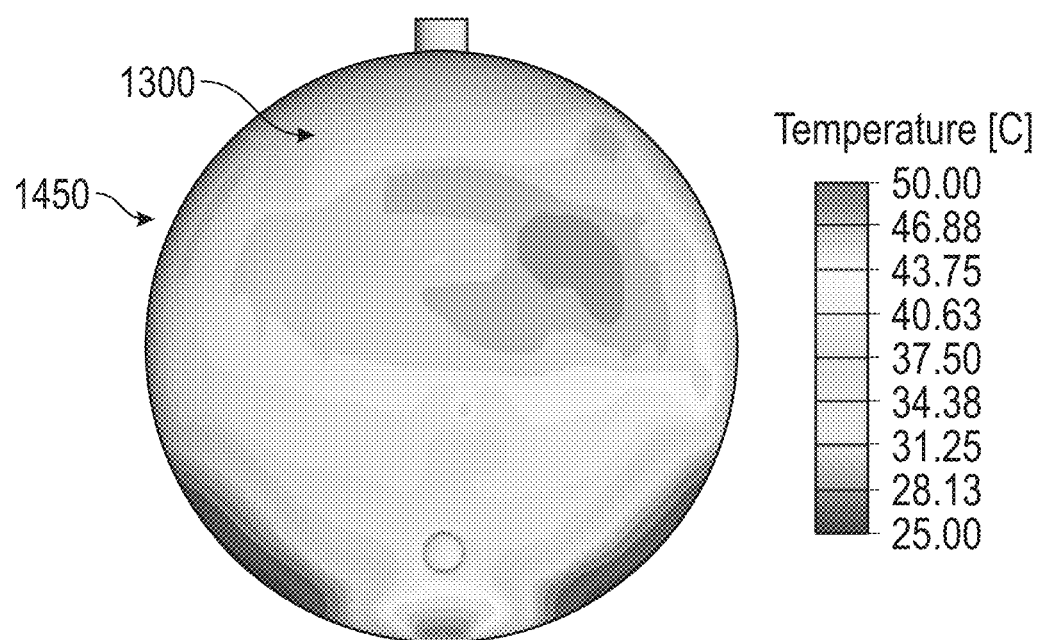
FIG. 14B is a schematic top view of the heat transfer map of FIG. 14A.

FIG. 14A is a schematic heat transfer map 1450 of a side view of the electronic device of FIGS. 13A-13H during operation of the electronic devices. FIG. 14B is a schematic top view of the heat transfer map 1450. As shown in FIGS. 14A and 14B, the temperature profile of the first enclosure 1300 (in which the processor(s) may be disposed) may be significantly higher than the temperature profile of the second enclosure 1301 (in which the battery(ies) may be disposed), indicating that the connection portion 1365 and/or the gap 1367 provide adequate thermal separation between the enclosures 1300, 1301. Various embodiments can beneficially provide thermal separation between the enclosures 1300, 1301 of at least 40° C., at least 50° C., etc.

Figure 15B:
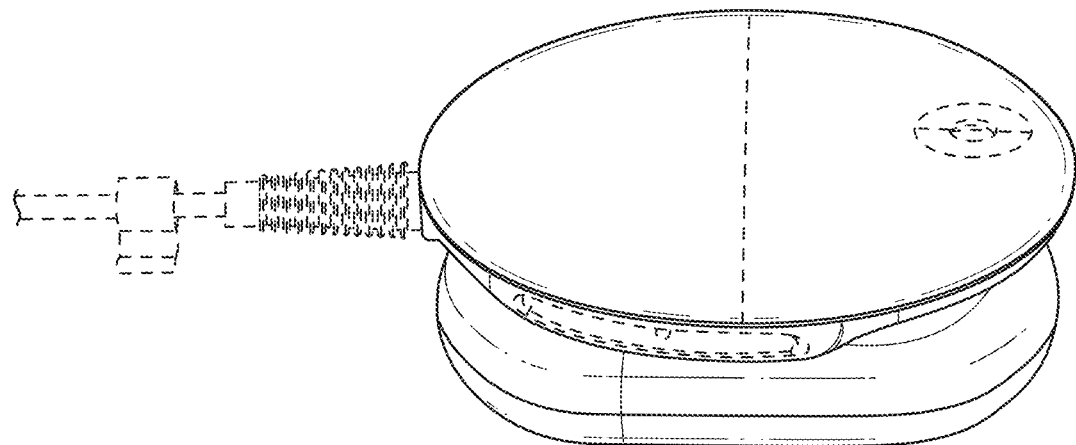
FIG. 15B is a schematic front, right perspective view of the electronic device of FIG. 15A.
Figure 15A:
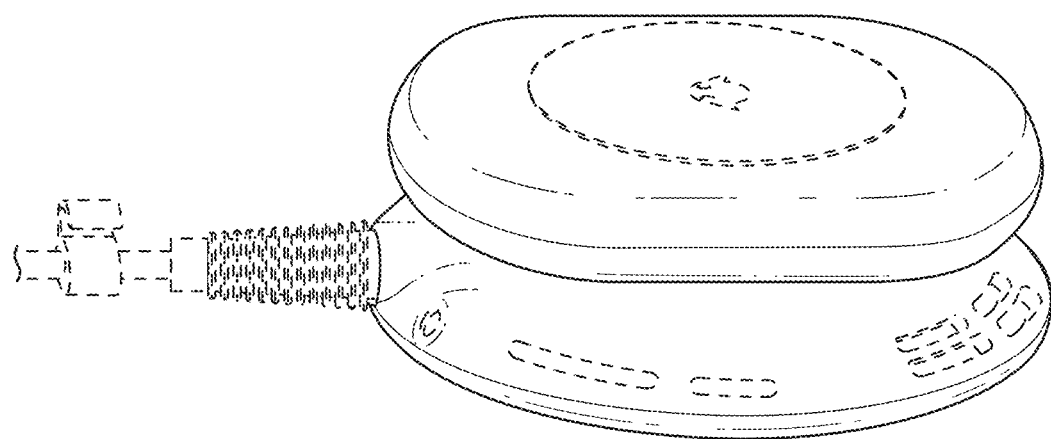
FIG. 15A is a schematic back, left perspective view of an electronic device according to one embodiment of a present design.
Figure 15D:
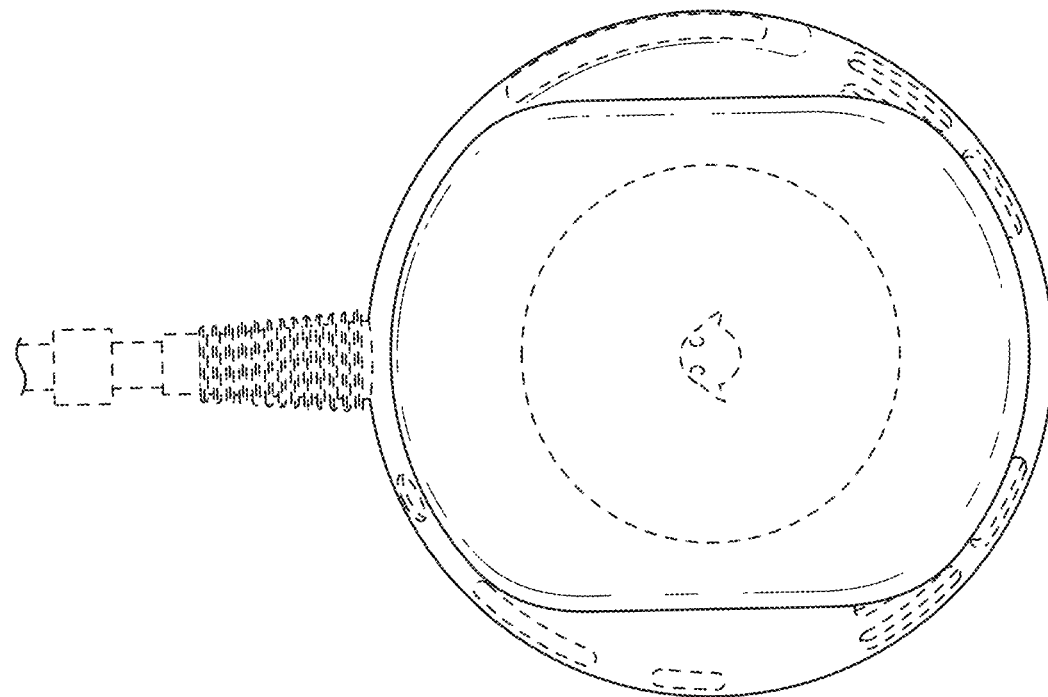
FIG. 15D is a schematic back plan view of the electronic device of FIGS. 15A-15C.
Figure 15C:
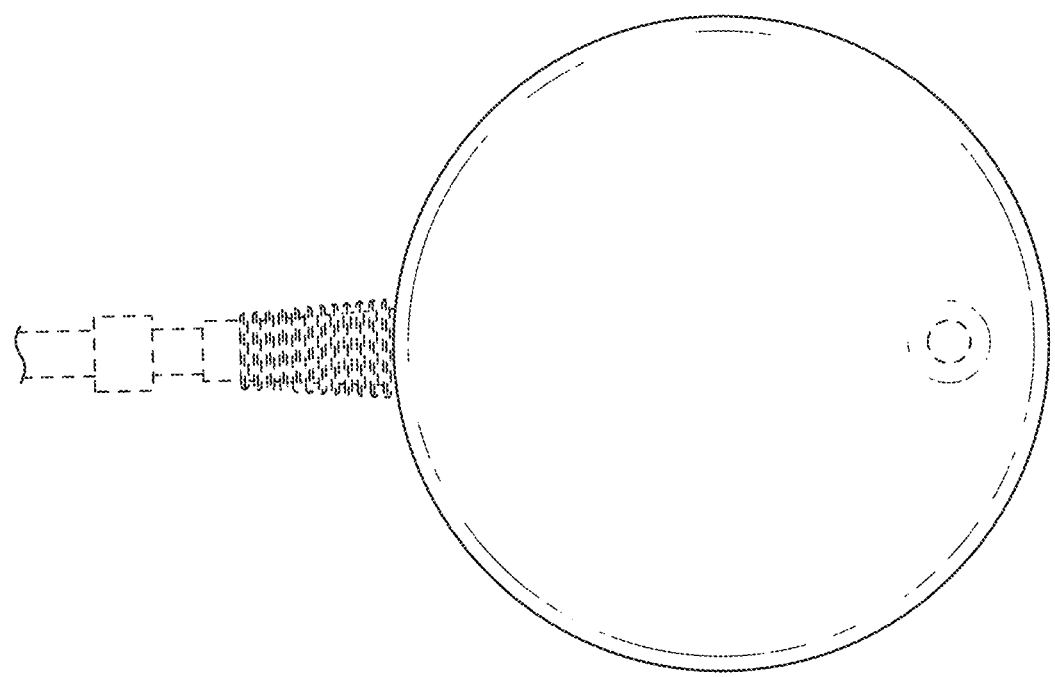
FIG. 15C is a schematic front plan view of the electronic device of FIGS. 15A-15B.
Figure 15F:
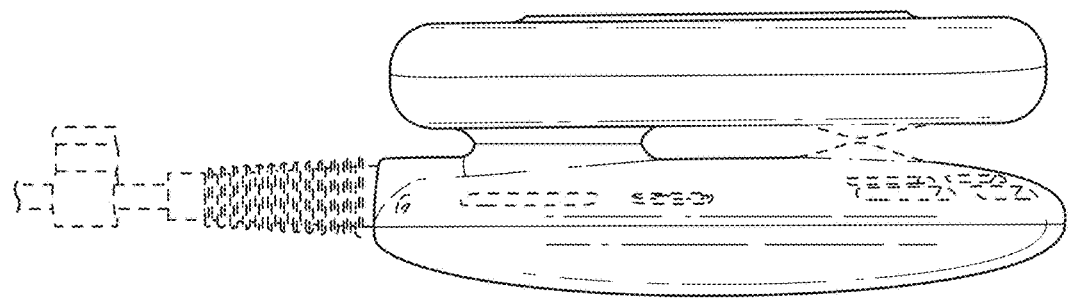
FIG. 15F is a schematic left side view of the electronic device of FIGS. 15A-15E.
Figure 15E:
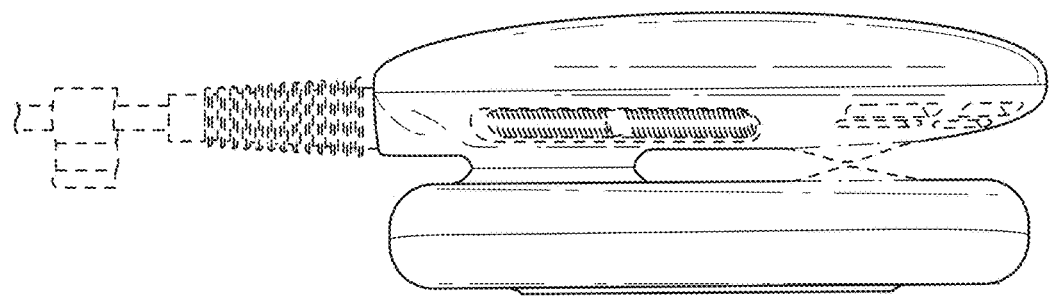
FIG. 15E is a schematic right side view of the electronic device of FIGS. 15A-15D.
Figure 15H:
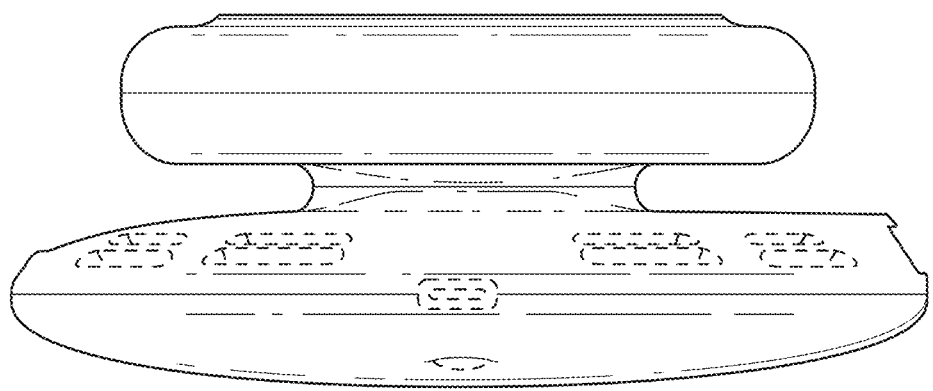
FIG. 15H is a schematic bottom plan view of the electronic device of FIGS. 15A-15G.
Figure 15G:
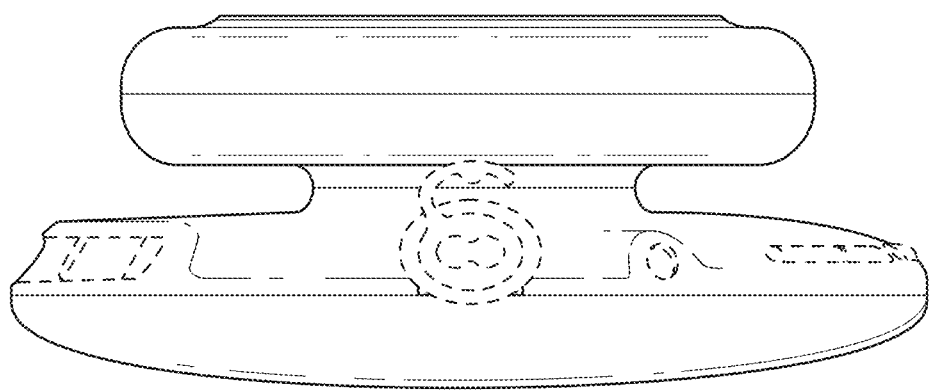
FIG. 15G is a schematic top plan view of the electronic device of FIGS. 15A-15F.

In various embodiments disclosed herein, we, the inventors, have invented new, original and ornamental designs for an electronic device. In FIGS. 15A-15H, the shading shows contours and the broken lines are for illustrative purposes and form no part of the claimed design. FIG. 15A is a schematic back, left perspective view of an electronic device according to one embodiment of the present design. FIG. 15B is a schematic front, right perspective view of the electronic device of FIG. 15A. FIG. 15C is a schematic front plan view of the electronic device of FIGS. 15A-15B. FIG. 15D is a schematic back plan view of the electronic device of FIGS. 15A-15C. FIG. 15E is a schematic right side view of the electronic device of FIGS. 15A-15D. FIG. 15F is a schematic left side view of the electronic device of FIGS. 15A-15E. FIG. 15G is a schematic top plan view of the electronic device of FIGS. 15A-15F. FIG. 15H is a schematic bottom plan view of the electronic device of FIGS. 15A-15G. Various embodiments are accordingly directed to the ornamental designs for an electronic device, as shown and described herein, including at least in FIGS. 15A-15H.

Example Embodiments

Embodiment 1: An electronic device comprising:
a housing comprising:
  a first compartment in which a first electronic component is disposed;
  a second compartment in which a second electronic component is disposed, one or both of the first and second electrical components electrically communicating with another component of the electronic device; and
  a connection portion extending between the first and second compartments,
  wherein the first compartment is separated from the second compartment at a location spaced away from the connection portion by a gap to provide thermal separation between the first and second electronic components.

Embodiment 2: The electronic device of Embodiment 1, wherein the first electronic component comprises a processor.

Embodiment 3: The electronic device of any one of Embodiments 1 to 2, wherein the second electronic component comprises a power supply.

Embodiment 4: The electronic device of Embodiment 3, wherein the power supply comprises a battery.

Embodiment 5: The electronic device of any one of Embodiments 1 to 4, wherein the first compartment, the second compartment, and the connection portion are filled with a gas.

Embodiment 6: The electronic device of any one of Embodiments 1 to 5, wherein the connection portion comprises a channel between the first and second compartments.

Embodiment 7: The electronic device of Embodiment 6, wherein the channel has a side cross-sectional area that is smaller than a cross-sectional area of the first compartment taken along a direction parallel to a maximum dimension of the first compartment.

Embodiment 8: The electronic device of any one of Embodiments 1 to 7, wherein the electronic device comprises an augmented reality device.

Embodiment 9: The electronic device of Embodiment 8, further comprising a connector configured to connect to a headpiece to be worn by a user.

Embodiment 10: The electronic device of any one of Embodiments 1 to 9, wherein the first electronic component electrically communicates with the second electronic component.

Embodiment 11: The electronic device of any one of Embodiments 1 to 10, further comprising a clip disposed in the gap between the first and second compartments.

Embodiment 12: A portable electronic device comprising:
a housing;
a battery disposed in the housing, the battery supplying power for at least a portion of the portable electronic device;
electronic components for operating the portable electronic device, the electronic components disposed in the housing; and
a thermal mitigation assembly comprising a frame assembly, comprising:
  a shaft assembly having a first end and a second end opposite the first end, the first and second ends supported by the frame assembly;
  an impeller having fan blades coupled with a hub, the hub being coupled with the shaft assembly for rotation within the housing about a longitudinal axis of the shaft assembly;
  wherein loading transverse to the longitudinal axis of the shaft assembly is controlled by the frame assembly at the second end of the shaft assembly; and
  wherein the thermal mitigation assembly removes heat generated from one or both of the battery and the electronic components.

Embodiment 13: The power supply assembly of Embodiment 12, wherein the housing comprises a first enclosure and a second enclosure, the electronic components and the thermal mitigation assembly disposed in the first enclosure and the battery disposed in the second enclosure.

Embodiment 14: The power supply assembly of Embodiment 12 or 13, wherein the shaft assembly comprises a first shaft portion connected to a first frame of the frame assembly and a second shaft portion connected to a second frame of the frame assembly, the first and second shaft portions disposed at least partially on opposing sides of the hub.

Embodiment 15: A fan assembly, comprising:
a first support frame;
a shaft assembly having a first end coupled with the first support frame and a second end disposed away from the first end;
a second support frame coupled with the first support frame and disposed at or over the second end of the shaft assembly;

an impeller having fan blades coupled with a hub, the hub being disposed over the shaft assembly for rotation between the first and second support frames about a longitudinal axis;

wherein transverse loading on the shaft assembly is controlled by the first and second support frames.

Embodiment 16: The fan assembly of Embodiment 15, wherein the second support frame comprises an airflow opening disposed about the longitudinal axis which extends between the first and second ends of the shaft assembly.

Embodiment 17: The fan assembly of Embodiment 16, further comprising a shaft support coupled with the second end of the shaft assembly, the shaft support being rigidly attached to the second support frame across the airflow opening.

Embodiment 18: The fan assembly of Embodiment 17, wherein the shaft support is supported at respective first and second portions of the second support frame, the respective first and second portions spaced apart about a periphery of the airflow opening.

Embodiment 19: The fan assembly of Embodiment 18, wherein the first portion of the second support frame is generally on an opposite side of the airflow opening relative to the second portion of the second support frame.

Embodiment 20: The fan assembly of any one of Embodiments 17 to 19, wherein the shaft support is disposed in a rotational position of the airflow opening corresponding to a maximum of air flow when the impeller is operating.

Embodiment 21: The fan assembly of any one of Embodiments 17 to 20, wherein the shaft support comprises an elongate member between first and second ends thereof, the elongate member having an airfoil shape.

Embodiment 22: The fan assembly of any one of Embodiments 17 to 21, wherein the shaft support comprises an elongate member between the first and second ends thereof, the elongate member having varying width along the length thereof.

Embodiment 23: The fan assembly of any one of Embodiments 17 to 22, wherein the shaft support comprises an elongate member between the first and second ends thereof, the elongate member having varying thickness along the length thereof.

Embodiment 24: The fan assembly of any one of Embodiments 15 to 23, wherein the shaft assembly comprises a first shaft portion rotationally fixed to the first support frame and a second portion rotationally fixed to the impeller, the second portion being rotatable over a free end of the first shaft portion of the shaft assembly.

Embodiment 25: The fan assembly of any one of Embodiments 15 to 24, wherein the shaft assembly comprises an elongate member having a first end disposed on a first side of the impeller and a second end disposed on a second side of the impeller, the second side being opposite the first side.

Embodiment 26: The fan assembly of Embodiment 25, further comprising a concave member coupled with the second support frame and configured to rotationally support the second end of the elongate member.

Embodiment 27: The fan assembly of Embodiment 26, further comprising an additional concave member coupled with the first support frame and configured to rotationally support the first end of the elongate member.

Embodiment 28: The fan assembly of any one of Embodiments 16 to 27, wherein an airflow pathway of the fan assembly extends between the airflow opening disposed about the longitudinal axis and a second airflow opening having a face disposed about an axis non-parallel to the longitudinal axis.

Embodiment 29: The fan assembly of Embodiment 28, wherein the axis non-parallel to the longitudinal axis is disposed generally perpendicular to the longitudinal axis and along a radial-extending axis of the impeller.

Embodiment 30: A fan assembly, comprising:
an enclosure supporting a shaft assembly at a first end, the shaft having a second end opposite the first end;
an impeller having fan blades coupled with a hub, the hub being coupled with the shaft for rotation within the enclosure about a longitudinal axis;
wherein transverse loading on the shaft assembly is controlled by the enclosure at the second end of the shaft assembly.

Embodiment 31: A fan assembly comprising:
a housing comprising a shaft support and a shaft assembly supported by the shaft support;
an impeller disposed in the housing and coupled with the shaft assembly, the impeller configured to rotate about a longitudinal axis of the shaft assembly;
a first airflow opening disposed about the longitudinal axis;
a second airflow opening having a face disposed about an axis non-parallel to the longitudinal axis; and
an airflow pathway of the fan assembly extending between the first airflow opening and the second airflow opening,
wherein the shaft support comprises an elongate member extending across at least a portion of the first airflow opening, the elongate member angularly positioned across the first airflow opening at an angle relative to the non-parallel axis that permits at least a local maximum of airflow through the first airflow opening.

Embodiment 32: The fan assembly of Embodiment 31, wherein the angle relative to the non-parallel axis is acute.

Embodiment 33: The fan assembly of Embodiment 32, wherein the angle relative to the non-parallel axis is in a range of −45° to 45°.

Embodiment 34: The fan assembly of Embodiment 33, wherein the angle relative to the non-parallel axis is in a range of −30° to 30°.

Embodiment 35: A method of manufacturing a fan assembly, the method comprising:
providing a fan assembly comprising:
a housing;
an impeller disposed in the housing and coupled with a shaft assembly, the impeller configured to rotate about a longitudinal axis of the shaft assembly;
a first airflow opening disposed about the longitudinal axis; and
a second airflow opening having a face disposed about an axis non-parallel to the longitudinal axis, wherein an airflow pathway of the fan assembly extends between the first airflow opening and the second airflow opening;
computing an airflow profile through the fan assembly; and
based on the computing, providing a shaft support to support an end of the shaft assembly, the shaft support comprising an elongate member extending across at least a portion of the first airflow opening.

Embodiment 36: The method of Embodiment 35, further comprising, based on the computing, angularly positioning the elongate member at least partially across the first airflow opening at an angle relative to the non-parallel axis that permits at least a local maximum of airflow through the first airflow opening.

Embodiment 37: The method of Embodiment 36, wherein angularly positioning comprises orienting the angle relative to the non-parallel axis at an acute angle.

Embodiment 38: The method of Embodiment 37, wherein angularly positioning comprises orienting the angle relative to the non-parallel axis in a range of −45° to 45°.

Embodiment 39: The method of Embodiment 38, wherein angularly positioning comprises orienting the angle relative to the non-parallel axis in a range of −30° to 30°.

Additional Considerations

Any processes, methods, and algorithms described herein and/or depicted in the attached figures may be embodied in, and fully or partially automated by, code modules executed by one or more physical computing systems, hardware computer processors, application-specific circuitry, and/or electronic hardware configured to execute specific and particular computer instructions. For example, computing systems can include general purpose computers (e.g., servers) programmed with specific computer instructions or special purpose computers, special purpose circuitry, and so forth. A code module may be compiled and linked into an executable program, installed in a dynamic link library, or may be written in an interpreted programming language. In some implementations, particular operations and methods may be performed by circuitry that is specific to a given function.

Further, certain implementations of the functionality of the present disclosure are sufficiently mathematically, computationally, or technically complex that application-specific hardware or one or more physical computing devices (utilizing appropriate specialized executable instructions) may be necessary to perform the functionality, for example, due to the volume or complexity of the calculations involved or to provide results substantially in real-time. For example, a video may include many frames, with each frame having millions of pixels, and specifically programmed computer hardware is necessary to process the video data to provide a desired image processing task or application in a commercially reasonable amount of time.

Code modules or any type of data may be stored on any type of non-transitory computer-readable medium, such as physical computer storage including hard drives, solid state memory, random access memory (RAM), read only memory (ROM), optical disc, volatile or non-volatile storage, combinations of the same and/or the like. The methods and modules (or data) may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The results of the disclosed processes or process steps may be stored, persistently or otherwise, in any type of non-transitory, tangible computer storage or may be communicated via a computer-readable transmission medium.

Any processes, blocks, states, steps, or functionalities in flow diagrams described herein and/or depicted in the attached figures should be understood as potentially representing code modules, segments, or portions of code which include one or more executable instructions for implementing specific functions (e.g., logical or arithmetical) or steps in the process. The various processes, blocks, states, steps, or functionalities can be combined, rearranged, added to, deleted from, modified, or otherwise changed from the illustrative examples provided herein. In some embodiments, additional or different computing systems or code modules may perform some or all of the functionalities described herein. The methods and processes described herein are also not limited to any particular sequence, and the blocks, steps, or states relating thereto can be performed in other sequences that are appropriate, for example, in serial, in parallel, or in some other manner. Tasks or events may be added to or removed from the disclosed example embodiments. Moreover, the separation of various system components in the implementations described herein is for illustrative purposes and should not be understood as requiring such separation in all implementations. It should be understood that the described program components, methods, and systems can generally be integrated together in a single computer product or packaged into multiple computer products. Many implementation variations are possible.

The processes, methods, and systems may be implemented in a network (or distributed) computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network or any other type of communication network.

The invention includes methods that may be performed using the subject devices. The methods may comprise the act of providing such a suitable device. Such provision may be performed by the end user. In other words, the "providing" act merely requires the end user obtain, access, approach, position, set-up, activate, power-up or otherwise act to provide the requisite device in the subject method. Methods recited herein may be carried out in any order of the recited events which is logically possible, as well as in the recited order of events.

The systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure. Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. No single feature or group of features is necessary or indispensable to each and every embodiment.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Except as specifically defined herein, all technical and scientific terms used herein are to be given as broad a commonly understood meaning as possible while maintaining claim validity.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y and at least one of Z to each be present.

Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted can be incorporated in the example methods and processes that are schematically illustrated. For example, one or more additional operations can be performed before, after, simultaneously, or between any of the illustrated operations. Additionally, the operations may be rearranged or reordered in other implementations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A wearable electronic device of an augmented reality system having a head-worn display, the wearable electronic device comprising:
    a housing including a first enclosure having a first compartment in which one or more electronic components for operating aspects of the augmented reality system are disposed, a second enclosure having a second compartment in which a battery for supplying power to at least a portion of the wearable electronic device is disposed, and a connection portion extending between the first and second enclosures, the connection portion comprising a channel that provides fluid communication between the first and second compartments,
    wherein the first enclosure is supported in a cantilevered manner relative to the second enclosure by the connection portion such that the first enclosure is separated from the second enclosure at a location spaced away from the connection portion by a gap to provide thermal separation between the one or more electronic components disposed in the first compartment and the battery disposed in the second compartment, and
    wherein the housing is configured to be worn by a user by utilizing the gap between the first and second enclosures.

2. The wearable electronic device of claim 1, wherein the first enclosure is connected to the second enclosure solely by the connection portion.

3. The wearable electronic device of claim 1, wherein each of the first and second enclosures have a proximal end near the connection portion and a distal end opposite the proximal end, and the distal ends of the first and second enclosures are free ends.

4. The wearable electronic device of claim 1, wherein the gap extends from an outer periphery of the connection portion radially outward without interruption.

5. The wearable electronic device of claim 1, wherein each of the first and second enclosures are disc-shaped.

6. The wearable electronic device of claim 1, wherein the one or more electronic components disposed in the first compartment comprise a processor.

7. The wearable electronic device of claim 1, wherein the channel of the connection portion has a cross-sectional area that is smaller than a cross-sectional area of the first compartment taken along a direction parallel to a maximum dimension of the first compartment, and that is smaller than a cross-sectional area of the second compartment taken along a direction parallel to a maximum dimension of the second compartment.

8. The wearable electronic device of claim 1, further comprising a connector configured to connect the wearable electronic device to the head-worn display of the augmented reality system to facilitate electrical communication therebetween.

9. The wearable electronic device of claim 1, further comprising a clip disposed in the gap between the first and second compartments to assist in securing the wearable electronic device to the user during operation of the augmented reality system.

10. A wearable electronic of an augmented reality system having a head-worn display, the portable electronic device comprising:
    a housing including a first enclosure having a first compartment in which one or more electronic components for operating aspects of the augmented reality system are disposed, a second enclosure having a second compartment in which a battery for supplying power to at least a portion of the wearable electronic device is disposed, and
    a connection portion extending between the first and second enclosures, the connection portion comprises a channel that provides fluid communication between the first and second compartments, wherein the first enclosure is supported in a cantilevered manner relative to the second enclosure by the connection portion such that the first enclosure is separated from the second enclosure at a location spaced away from the connection portion by a gap to provide thermal separation between the one or more electronic components disposed in the first compartment and the battery disposed in the second compartment.

11. The wearable electronic device of claim 10, wherein the housing is configured to be worn by a user by utilizing the gap between the first and second enclosures.

12. The wearable electronic device of claim 10, wherein the channel of the connection portion has a cross-sectional area that is smaller than a cross-sectional area of the first compartment taken along a direction parallel to a maximum dimension of the first compartment, and that is smaller than a cross-sectional area of the second compartment taken along a direction parallel to a maximum dimension of the second compartment.

13. The wearable electronic device of claim 10, further comprising:
a thermal mitigation assembly disposed in the first enclosure to assist in removing heat generated from the one or more electronic components disposed in the first enclosure and the battery disposed in the second enclosure.

14. The wearable electronic device of claim 13, wherein the first enclosure is connected to the second enclosure solely by the connection portion.

15. The wearable electronic device of claim 13, wherein each of the first and second enclosures have a proximal end near the connection portion and a distal end opposite the proximal end, and the distal ends of the first and second enclosures are free ends.

16. The wearable electronic device of claim 13, wherein the gap extends from an outer periphery of the connection portion radially outward without interruption.

17. The wearable electronic device of claim 13, wherein each of the first and second enclosures are disc-shaped.

18. The wearable electronic device of claim 13, further comprising a connector configured to connect the wearable electronic device to the head-worn display of the augmented reality system to facilitate electrical communication therebetween.

19. The wearable electronic device of claim 13, further comprising a clip disposed in the gap between the first and second compartments to assist in securing the wearable electronic device to the user during operation of the augmented reality system.

* * * * *

UNITED STATES PATENT AND TRADEMARK OFFICE
CERTIFICATE OF CORRECTION

PATENT NO. : 12,085,999 B2
APPLICATION NO. : 18/243048
DATED : September 10, 2024
INVENTOR(S) : John Aguirre et al.

It is certified that error appears in the above-identified patent and that said Letters Patent is hereby corrected as shown below:

In the Claims

Column 34, Claim 14, Line 1:
"device of claim 13, wherein"
Should read:
--device of claim 10, wherein--.

Column 34, Claim 15, Line 4:
"device of claim 13, wherein"
Should read:
--device of claim 10, wherein--.

Column 34, Claim 16, Line 9:
"device of claim 13, wherein"
Should read:
--device of claim 10, wherein--.

Column 34, Claim 17, Line 12:
"device of claim 13, wherein"
Should read:
--device of claim 10, wherein--.

Column 34, Claim 18, Line 14:
"device of claim 13, further"
Should read:
--device of claim 10, wherein--.

Signed and Sealed this
Twenty-fourth Day of December, 2024

Derrick Brent
*Acting Director of the United States Patent and Trademark Office*

CERTIFICATE OF CORRECTION (continued)
U.S. Pat. No. 12,085,999 B2

<u>Column 34, Claim 19, Line 20:</u>
"device of claim 13, further"
Should read:
--device of claim 10, wherein--.